United States Patent
Jung et al.

(10) Patent No.: US 12,003,075 B2
(45) Date of Patent: Jun. 4, 2024

(54) SURFACE EMITTING LASER DEVICE AND SURFACE EMITTING LASER APPARATUS HAVING THE SAME

(71) Applicant: SUZHOU LEKIN SEMICONDUCTOR CO., LTD., Taicang (CN)

(72) Inventors: Se Yeon Jung, Seoul (KR); Seung Hwan Kim, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 603 days.

(21) Appl. No.: 17/275,982

(22) PCT Filed: Sep. 9, 2019

(86) PCT No.: PCT/KR2019/011652
§ 371 (c)(1),
(2) Date: Mar. 12, 2021

(87) PCT Pub. No.: WO2020/055069
PCT Pub. Date: Mar. 19, 2020

(65) Prior Publication Data
US 2022/0037852 A1 Feb. 3, 2022

(30) Foreign Application Priority Data
Sep. 13, 2018 (KR) .................. 10-2018-0109853

(51) Int. Cl.
*H01S 5/042* (2006.01)
*H01S 5/0237* (2021.01)
(Continued)

(52) U.S. Cl.
CPC .......... *H01S 5/0425* (2013.01); *H01S 5/0237* (2021.01); *H01S 5/04252* (2019.08);
(Continued)

(58) Field of Classification Search
CPC ......... H01S 5/18–187; H01S 5/42–426; H01S 5/0425–04252
See application file for complete search history.

(56) References Cited

U.S. PATENT DOCUMENTS 6,022,760 A * 2/2000 Lebby .................. H01S 5/423
438/106
6,242,761 B1 * 6/2001 Fujimoto .............. H01L 33/145
257/618
(Continued)

FOREIGN PATENT DOCUMENTS

CN       1619904 A  *  5/2005  ....... H01L 21/02389
CN     101253625 A  *  8/2008  ......... H01L 21/4853
(Continued)

OTHER PUBLICATIONS

International Search Report (PCT/ISA/210) issued in PCT/KR2019/011652, dated Jan. 3, 2020.

*Primary Examiner* — Joshua King
(74) *Attorney, Agent, or Firm* — Birch, Stewart, Kolasch & Birch, LLP

(57) ABSTRACT

The surface emitting laser device according to the embodiment includes a substrate, a first metal layer disposed on the substrate, a second metal layer disposed on the first metal layer, and a third metal layer disposed between the first metal layer and the second metal layer.

The first to third metal layers may include different materials, and the second metal layer may include copper (Cu).

The third metal layer may prevent diffusion of copper from the second metal layer into the first metal layer.

17 Claims, 15 Drawing Sheets

(51) Int. Cl.
*H01S 5/18* (2021.01)
*H01S 5/183* (2006.01)
*H01S 5/42* (2006.01)

(52) U.S. Cl.
CPC ............ *H01S 5/18* (2013.01); *H01S 5/18311* (2013.01); *H01S 5/04254* (2019.08); *H01S 5/423* (2013.01)

(56) References Cited

U.S. PATENT DOCUMENTS

| | | | |
|---|---|---|---|
| 6,333,945 B1* | 12/2001 | Abe | B82Y 20/00 372/45.01 |
| 7,596,163 B2 | 9/2009 | Yoshikawa et al. | |
| 2002/0028045 A1* | 3/2002 | Yoshimura | H01L 23/5389 385/39 |
| 2003/0070292 A1* | 4/2003 | Tatoh | H05K 3/108 257/E23.06 |
| 2004/0152224 A1* | 8/2004 | Sheppard | H01S 5/2231 438/39 |
| 2004/0161010 A1* | 8/2004 | Matsumura | H01S 5/22 372/46.01 |
| 2004/0245543 A1* | 12/2004 | Yoo | H01L 33/0093 438/22 |
| 2005/0213628 A1* | 9/2005 | Kishimoto | H01S 5/22 372/46.01 |
| 2006/0049417 A1* | 3/2006 | Li | H01S 5/0421 257/96 |
| 2006/0056463 A1 | 3/2006 | Wang et al. | |
| 2006/0102920 A1* | 5/2006 | Song | H01L 33/40 438/46 |
| 2006/0281309 A1* | 12/2006 | Trezza | H01S 5/04257 257/E21.705 |
| 2007/0231963 A1* | 10/2007 | Doan | H01L 33/0093 438/455 |
| 2008/0194051 A1* | 8/2008 | Chu | B23K 26/40 438/33 |
| 2010/0059790 A1* | 3/2010 | Takeuchi | H01S 5/04252 257/E33.056 |
| 2010/0232465 A1* | 9/2010 | Tsukiji | H01S 5/04252 438/22 |
| 2011/0198646 A1* | 8/2011 | Wu | H01L 33/60 438/27 |
| 2013/0279311 A1* | 10/2013 | Hurley | B23K 35/3013 228/180.1 |
| 2014/0087499 A1* | 3/2014 | Doan | H01L 33/0095 257/E33.056 |
| 2015/0043606 A1* | 2/2015 | Hamaguchi | H01S 5/18391 438/29 |
| 2016/0226592 A1* | 8/2016 | Arvelo | G02B 6/425 |
| 2017/0033535 A1* | 2/2017 | Joseph | H01S 5/423 |
| 2018/0366913 A1* | 12/2018 | Hua | H01L 33/12 |
| 2019/0371777 A1* | 12/2019 | Iguchi | H01L 24/29 |
| 2020/0105989 A1* | 4/2020 | Kato | H01L 33/502 |
| 2020/0112141 A1* | 4/2020 | Sato | H01S 5/18327 |
| 2021/0281037 A1* | 9/2021 | Yu | H01S 5/423 |

FOREIGN PATENT DOCUMENTS

| | | | | |
|---|---|---|---|---|
| CN | 104300090 A | * | 1/2015 | ............... G11B 7/12 |
| DE | 102006057718 A1 | * | 6/2008 | ......... H01L 23/3735 |
| GB | 2300375 A | * | 11/1996 | ............ B23K 35/001 |
| JP | 2002217491 A | * | 8/2002 | ......... H01S 5/18397 |
| JP | 2002305358 A | * | 10/2002 | ........... H01S 5/0425 |
| JP | 2004-349274 A | | 12/2004 | |
| JP | 2006074042 A | * | 3/2006 | ........... H01L 33/405 |
| JP | 2007-59623 A | | 3/2007 | |
| JP | 2008-60338 A | | 3/2008 | |
| JP | 2009-146979 A | | 7/2009 | |
| JP | 2010114430 A | * | 5/2010 | ............. B82Y 20/00 |
| KR | 10-2009-0055331 A | | 6/2009 | |
| TW | I231321 B | * | 4/2005 | |
| WO | WO-2006138492 A2 | * | 12/2006 | ........ H01L 21/4853 |
| WO | WO-2015106972 A1 | * | 7/2015 | ........ H01S 5/02476 |
| WO | WO-2016006297 A1 | * | 1/2016 | ............. H01L 21/28 |
| WO | WO-2016158088 A1 | * | 10/2016 | ............... C09K 11/00 |
| WO | WO-2018212630 A1 | * | 11/2018 | ............. G01S 7/481 |

* cited by examiner

[FIG. 1]
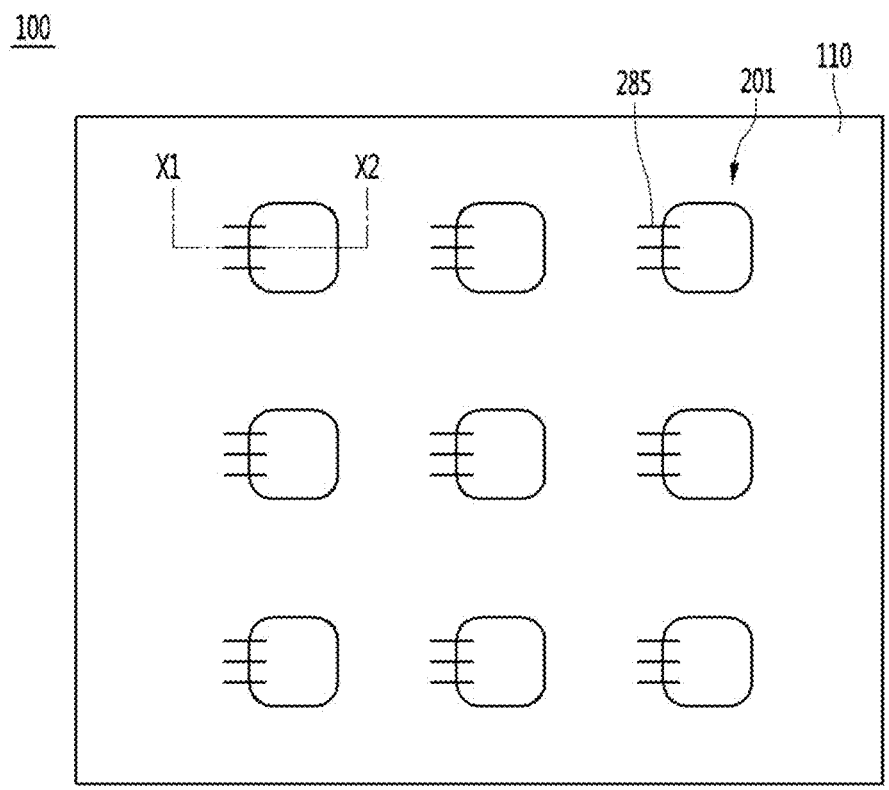
[FIG. 2]
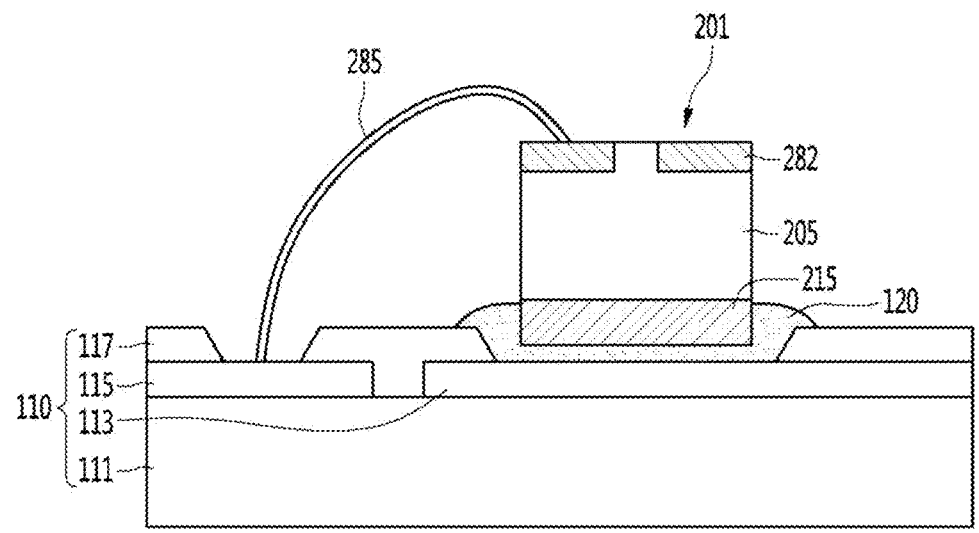

[FIG. 3]
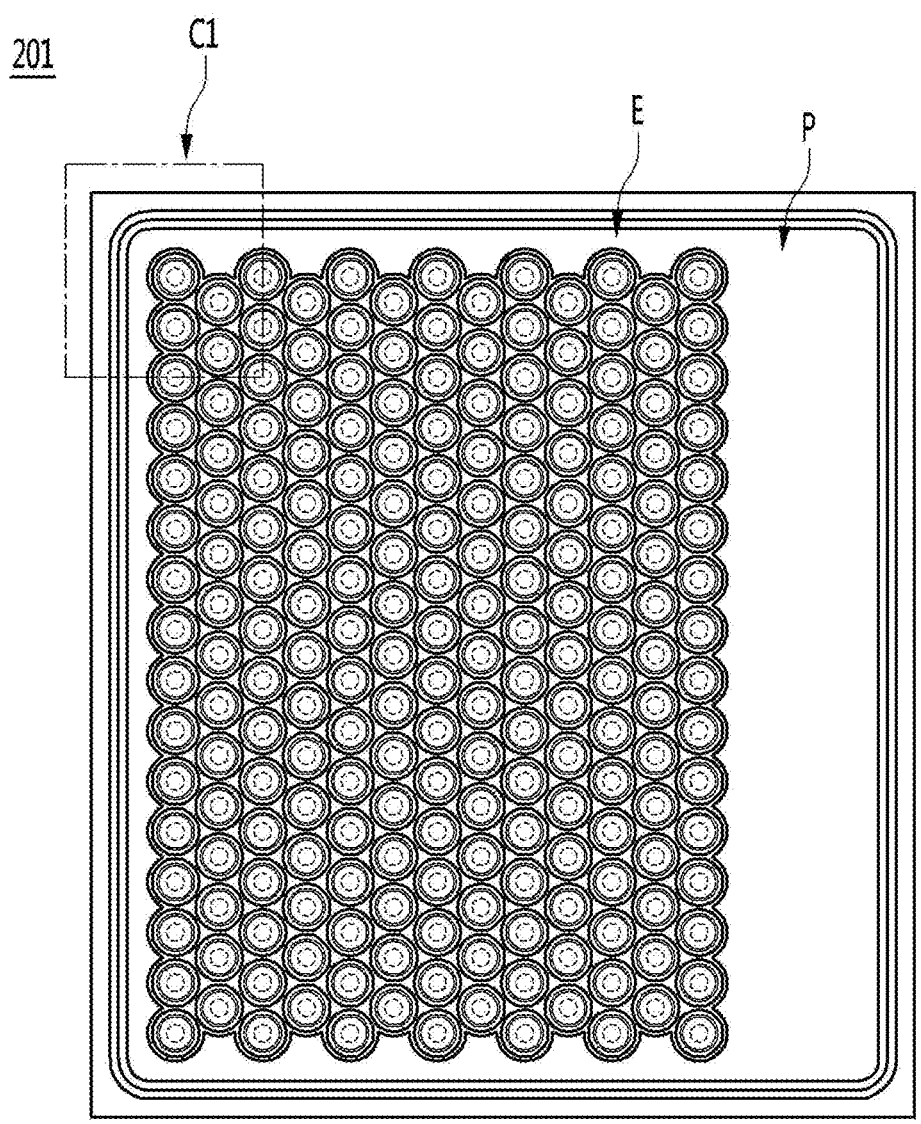

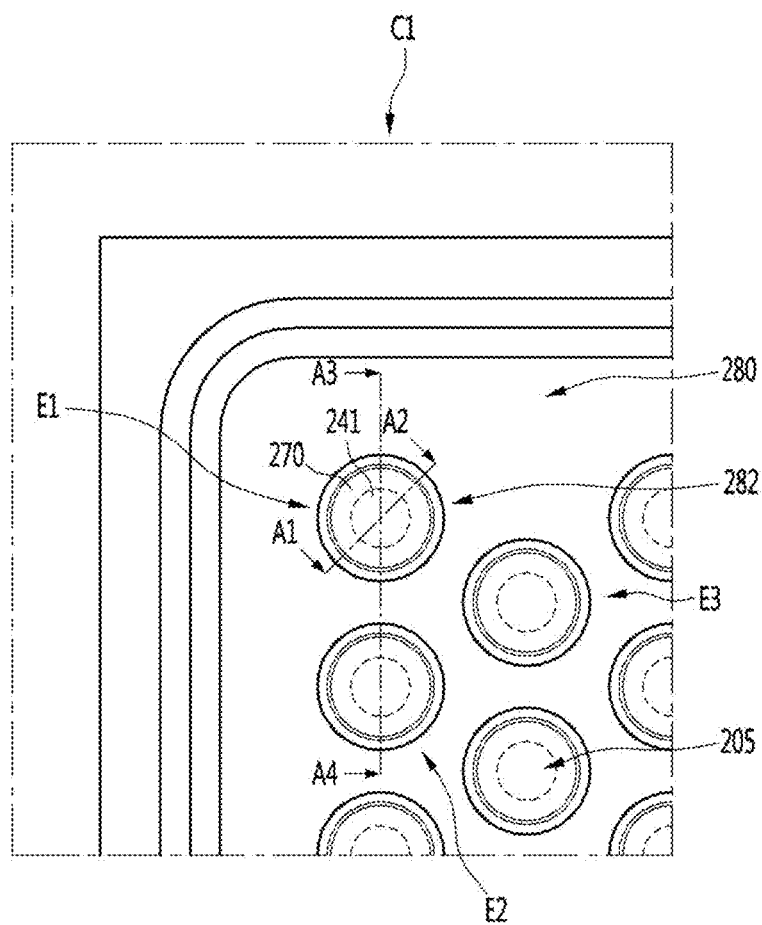
[FIG. 4]

[FIG. 5a]
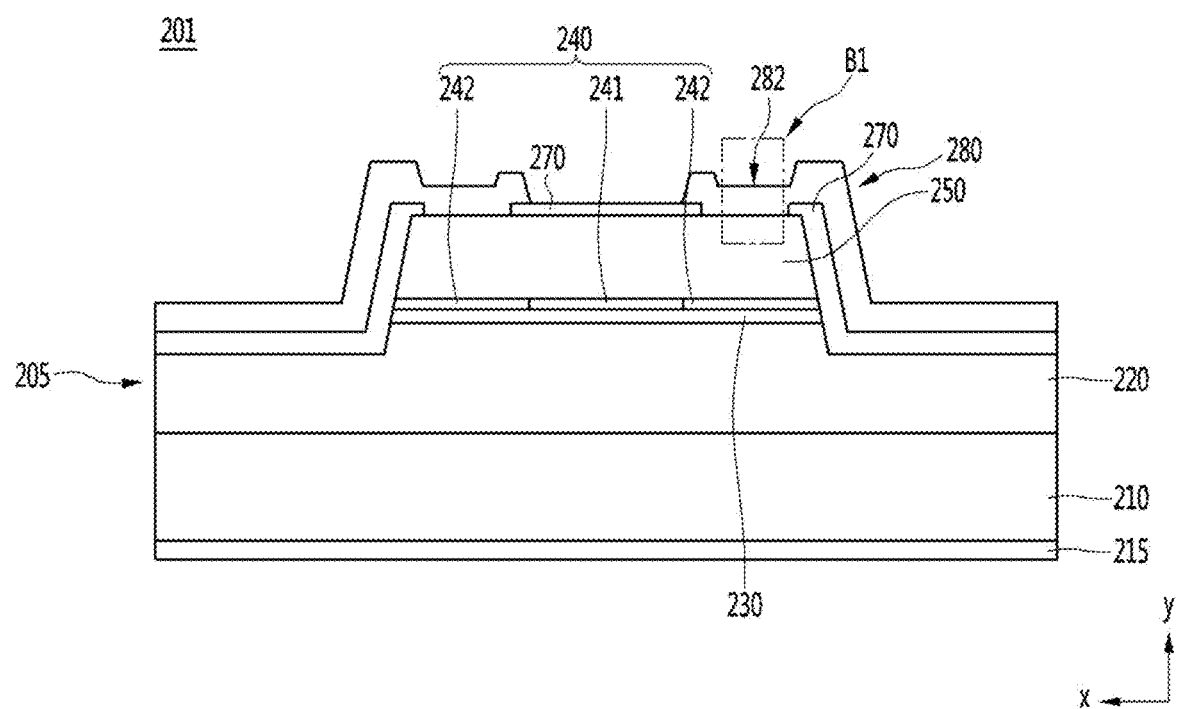

[FIG. 5b]
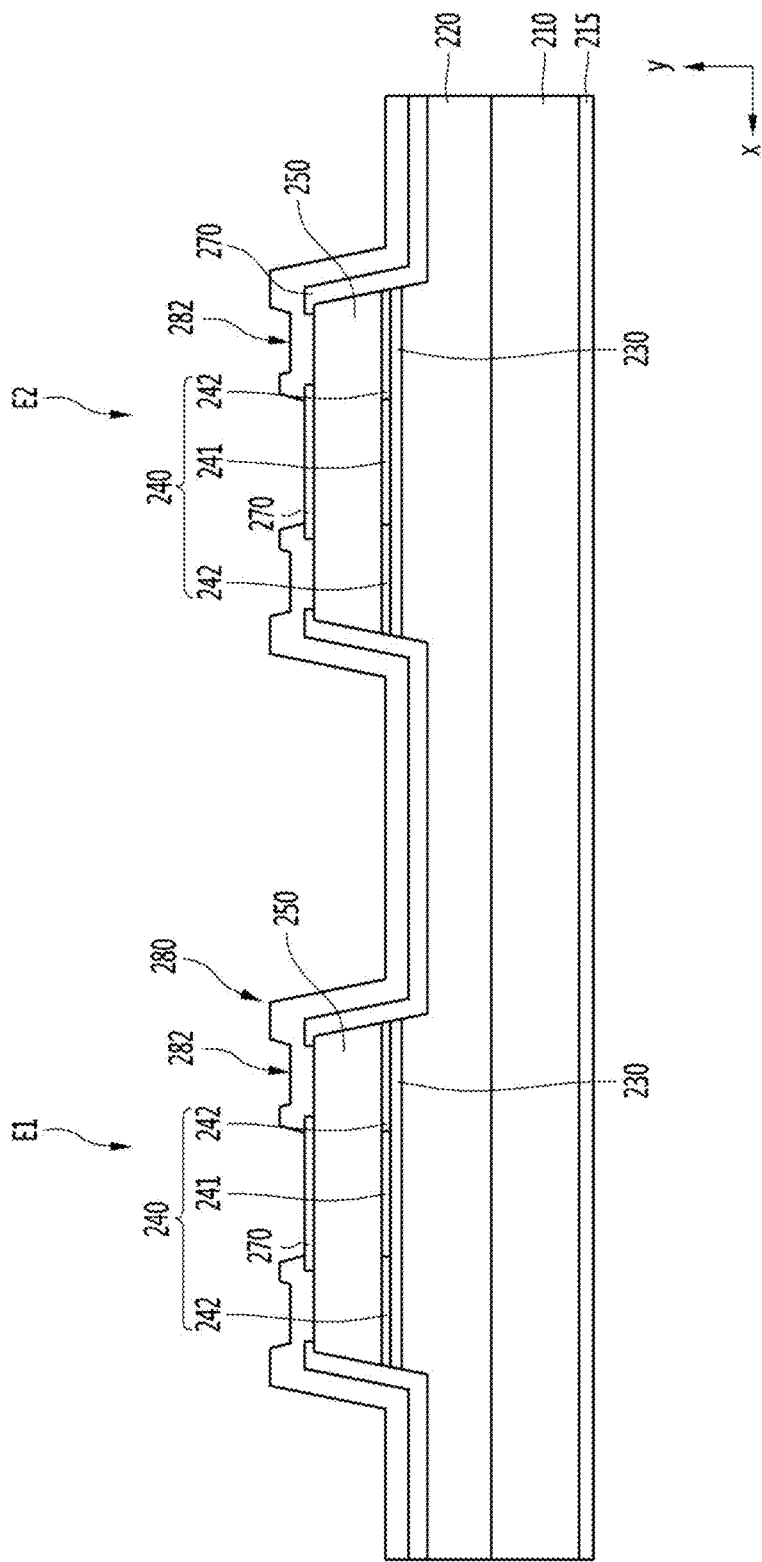

[FIG. 6]
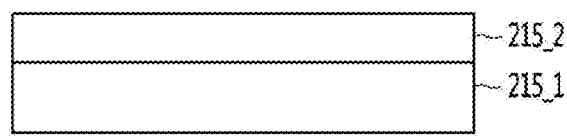
[FIG. 7]
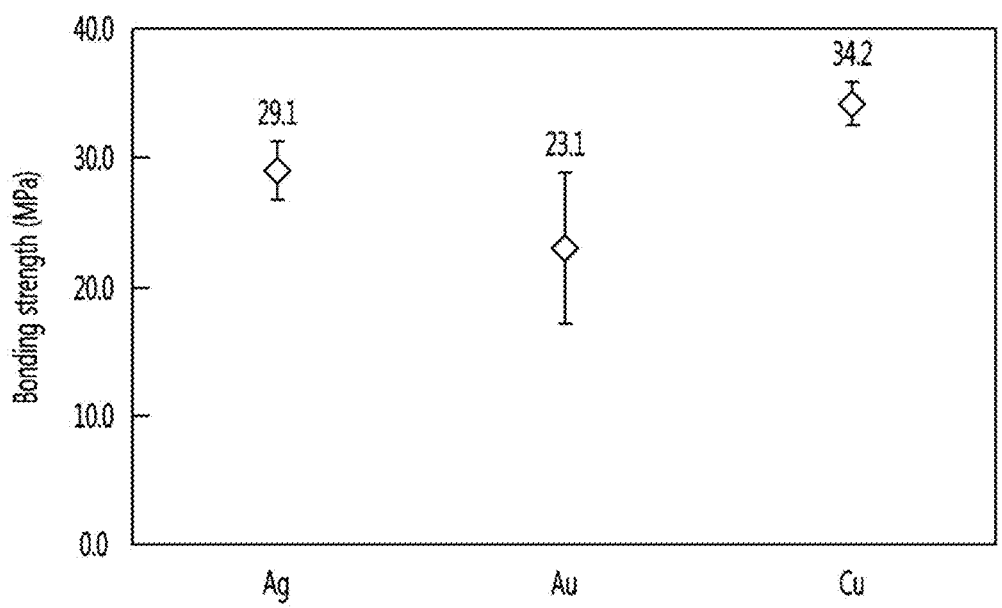

[FIG. 8a]
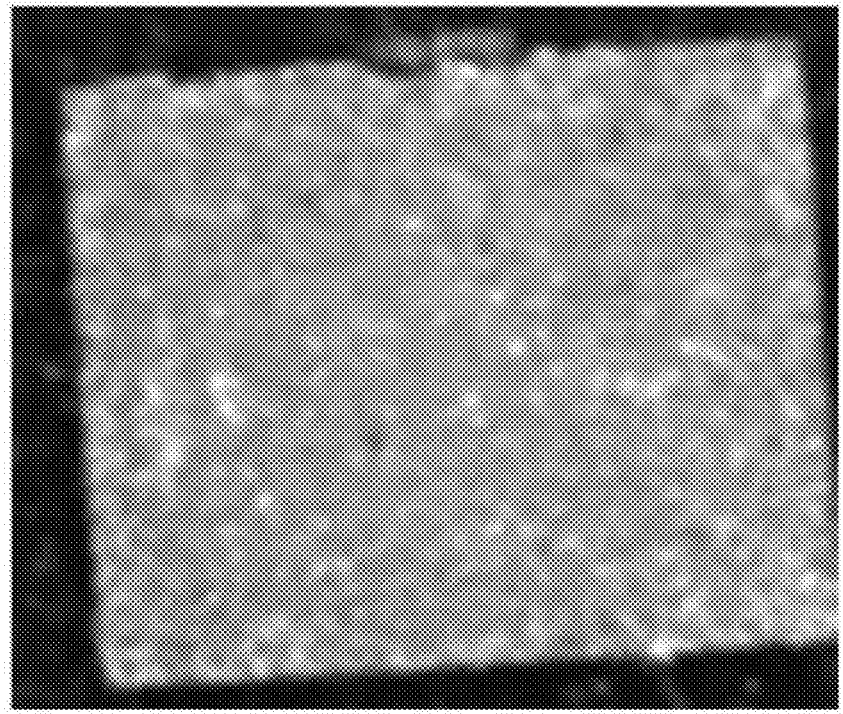
[FIG. 8b]
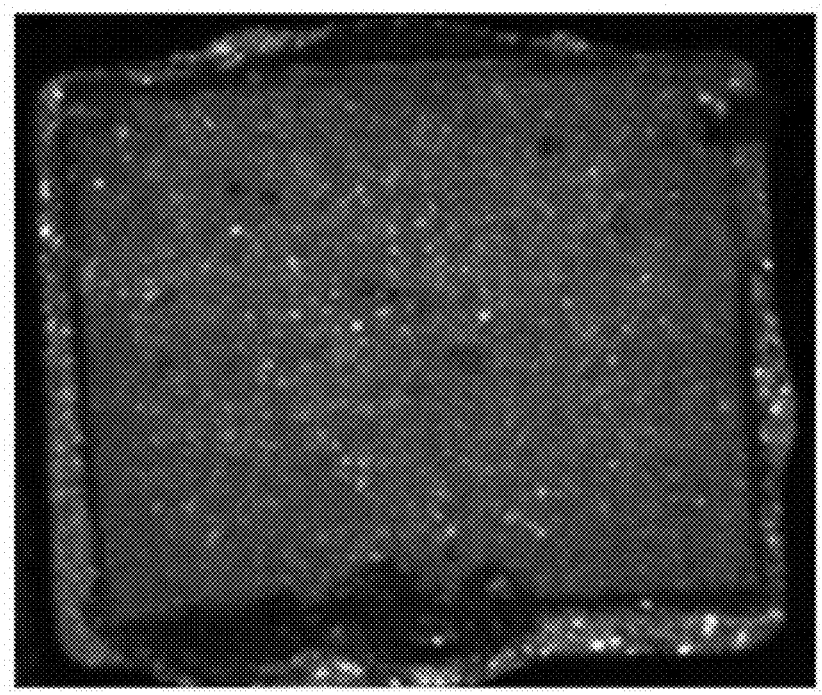

[FIG. 9a]
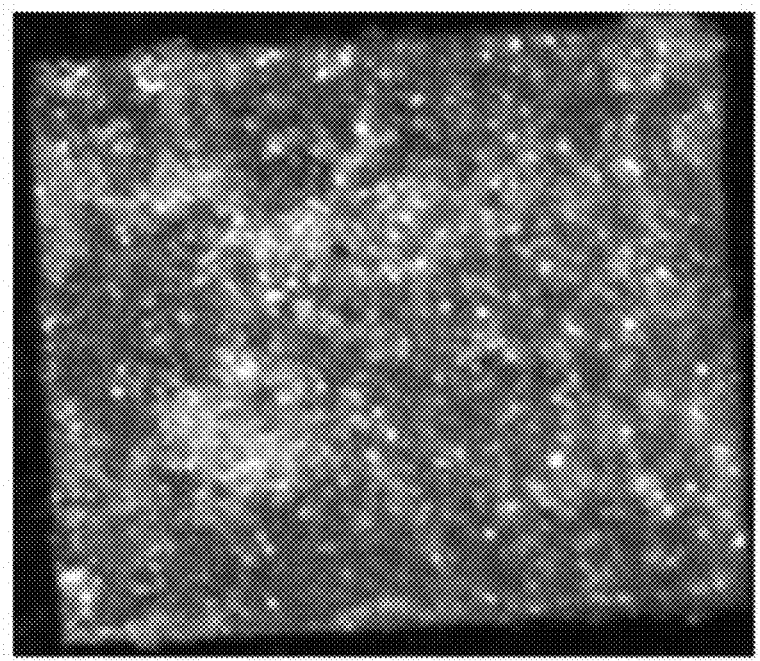
[FIG. 9b]
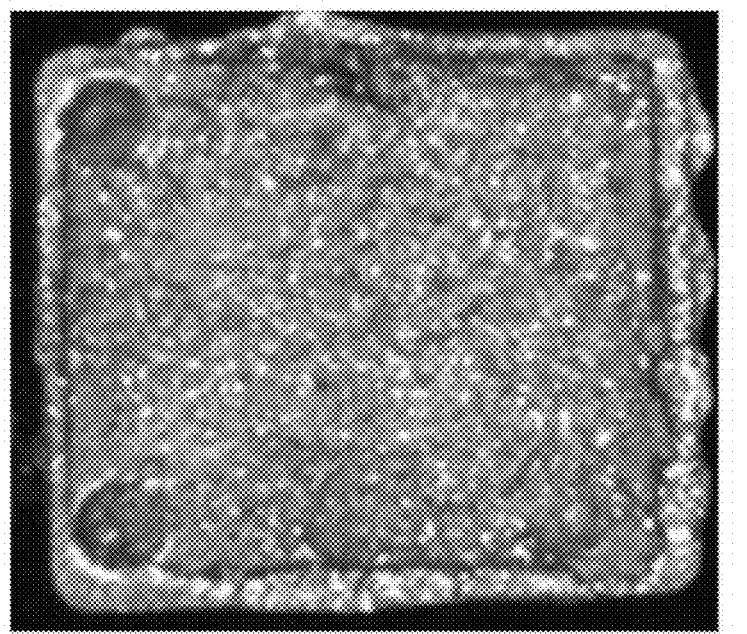

[FIG. 10]
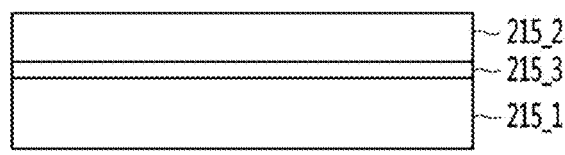
[FIG. 11]
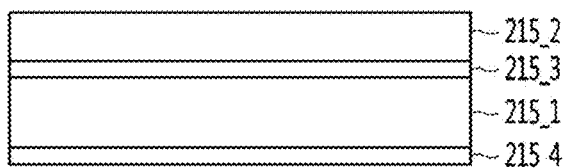
[FIG. 12]
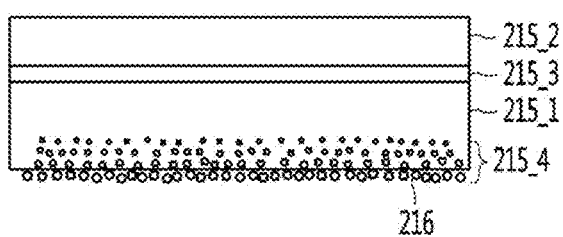

[FIG. 13]
215E
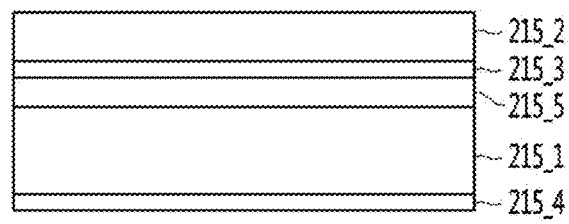
[FIG. 14]
215F
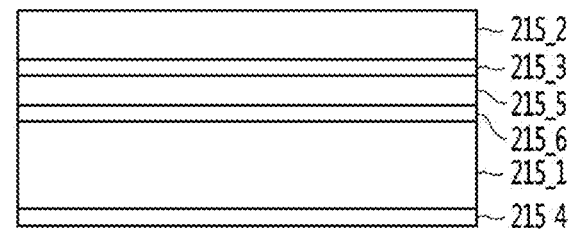
[FIG. 15]
215G
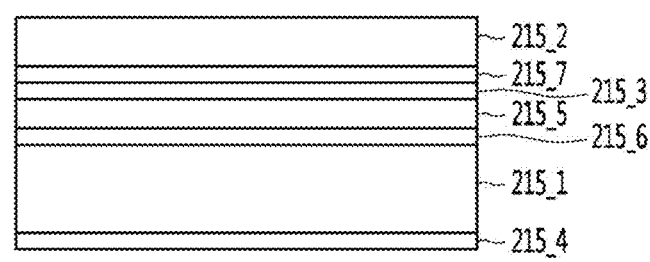

[FIG. 16]
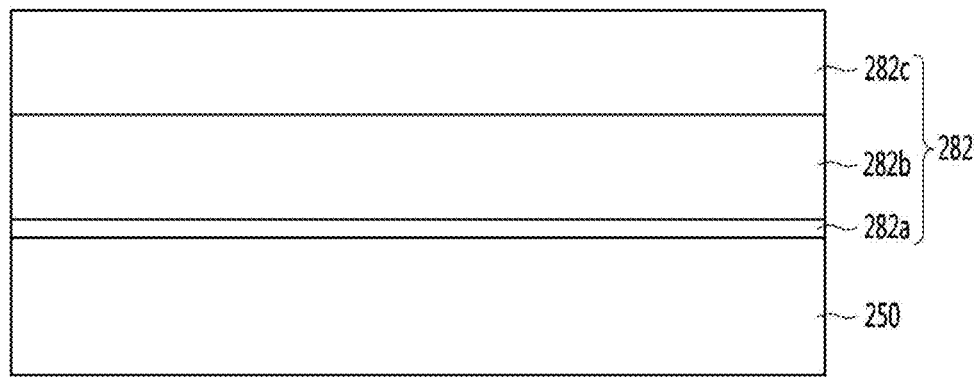
[FIG. 17a]
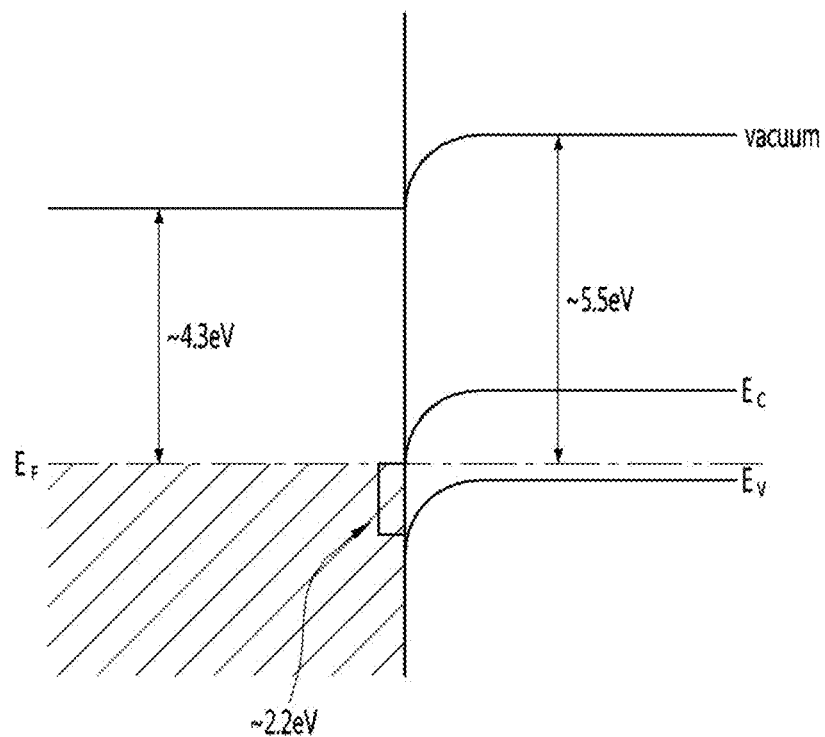

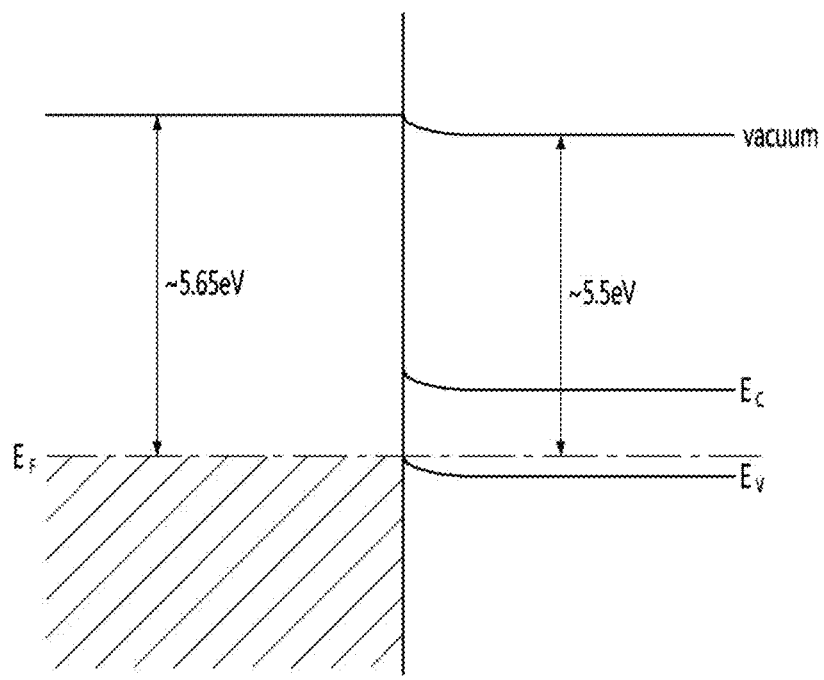
[FIG. 17b]

[FIG. 18]
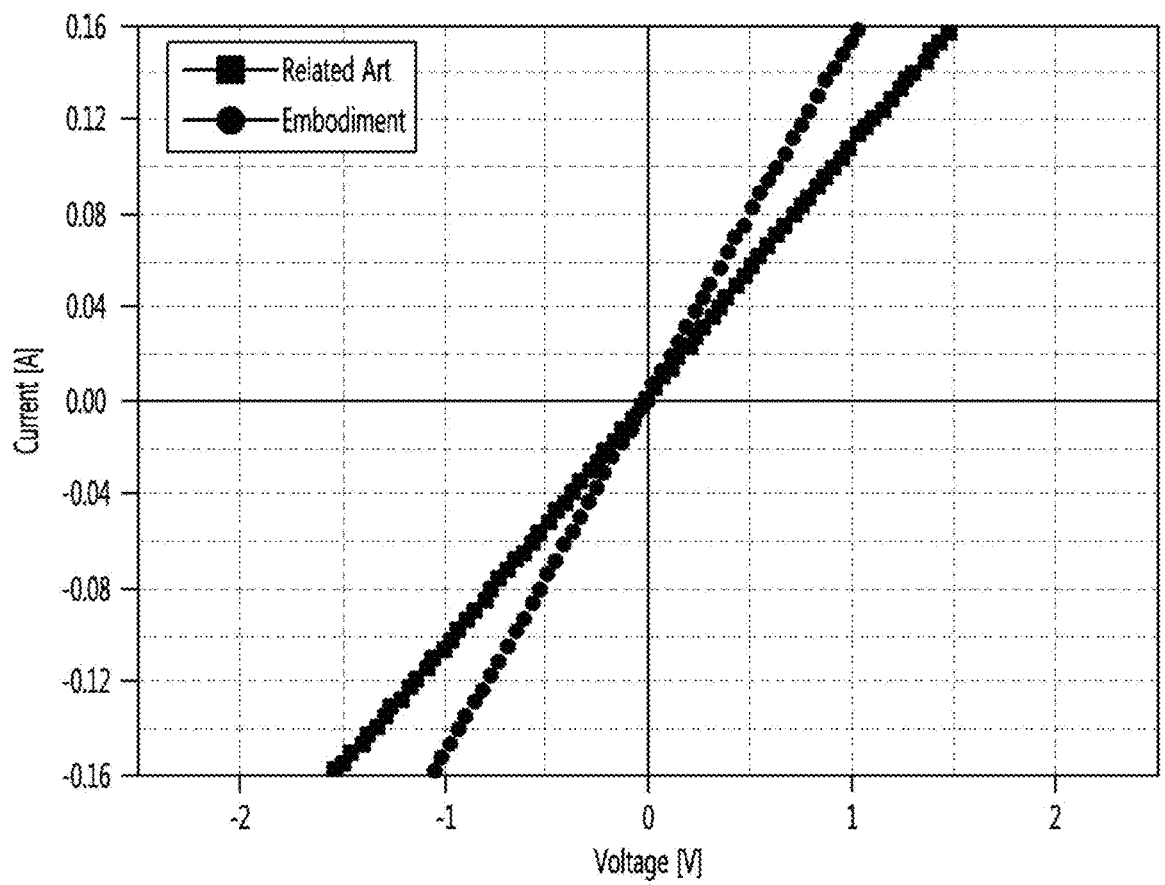
[FIG. 19]
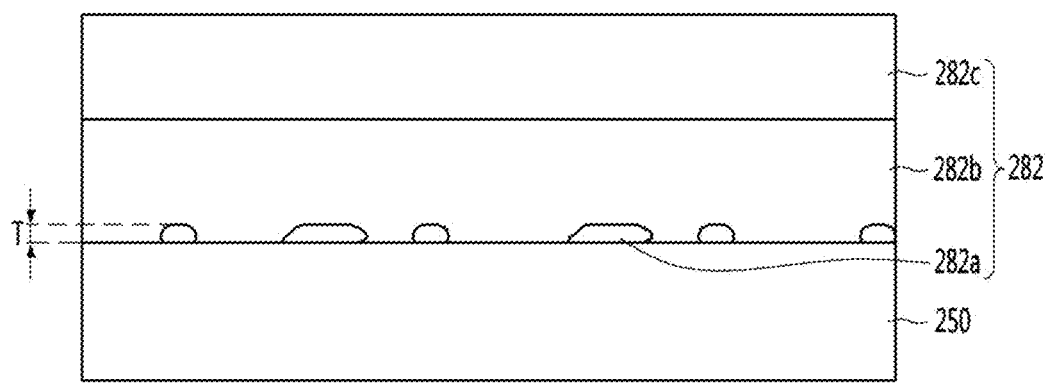

[FIG. 20]
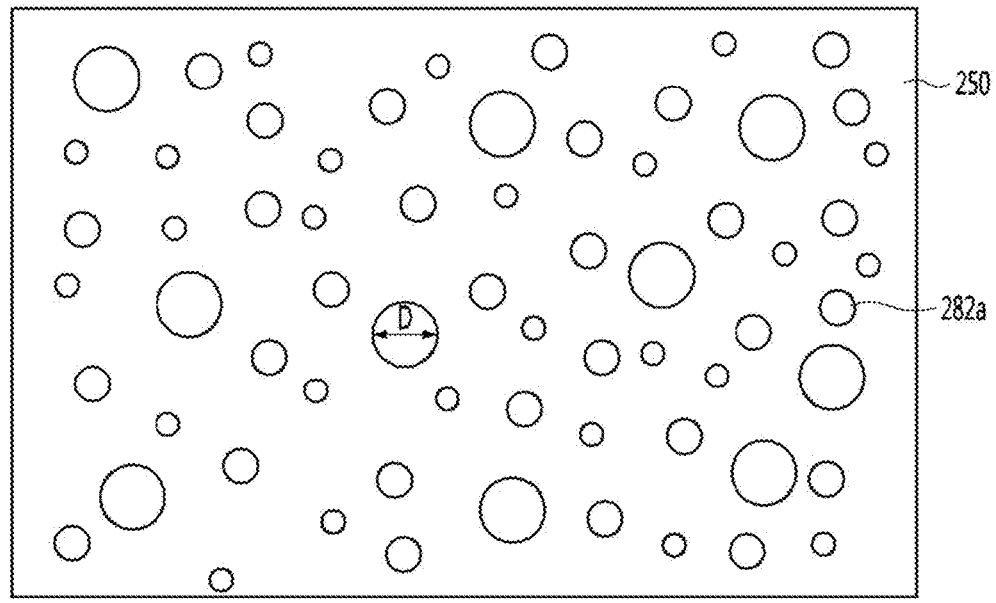
[FIG. 21]
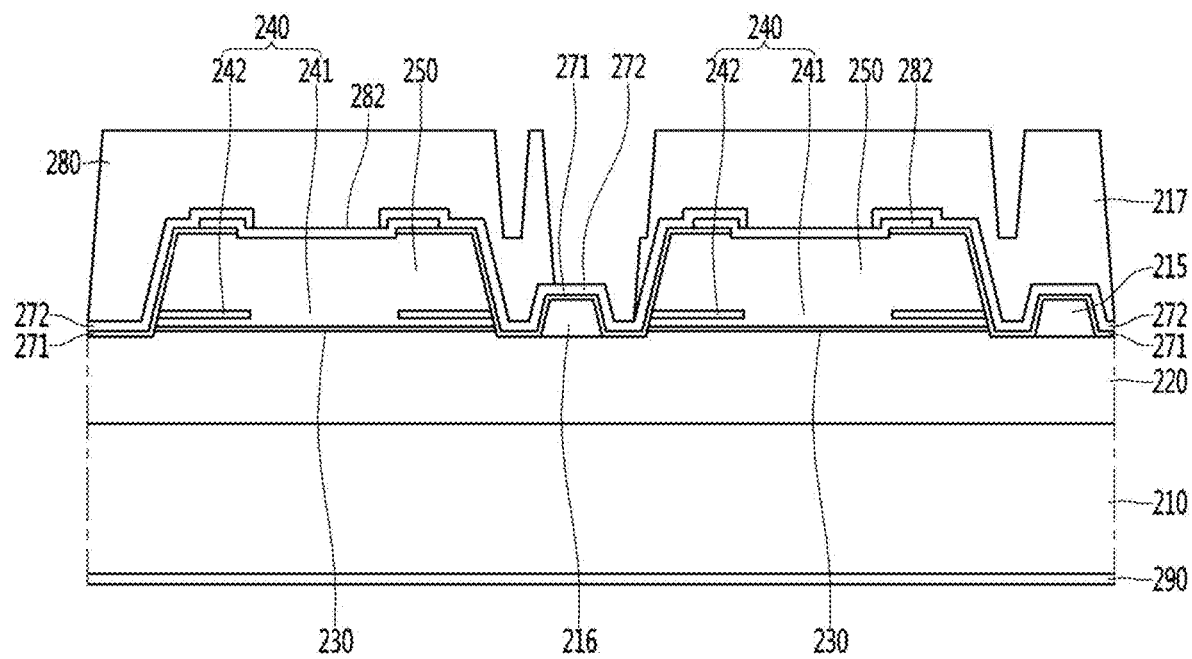

[FIG. 22]
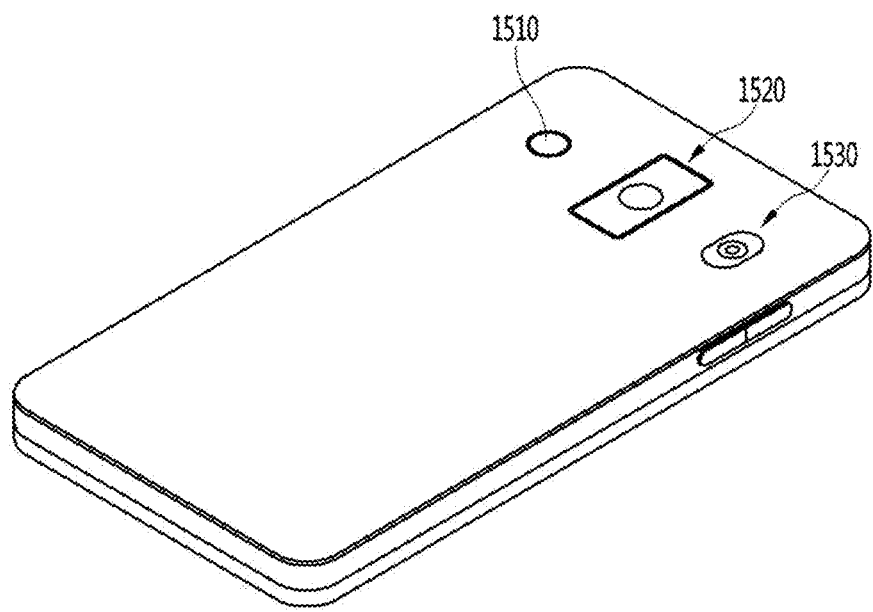

SURFACE EMITTING LASER DEVICE AND SURFACE EMITTING LASER APPARATUS HAVING THE SAME

CROSS REFERENCE TO RELATED APPLICATIONS

This application is the National Phase of PCT International Application No. PCT/KR2019/011652, filed on Sep. 9, 2019, which claims priority under 35 U.S.C. 119(a) to Patent Application No. 10-2018-0109853, filed in the Republic of Korea on Sep. 13, 2018, all of which are hereby expressly incorporated by reference into the present application.

TECHNICAL FIELD

The embodiment relates to a surface emitting laser device and a surface emitting laser apparatus having the same.

BACKGROUND ART

A semiconductor device including a compound such as GaN or AlGaN has many advantages, such as having a wide and easily adjustable band gap energy, and thus can be used in various ways as a light emitting device, a light receiving device, and various diodes.

In particular, light emitting devices such as light emitting diodes and laser diodes using a group III-V or II-VI compound semiconductor material of semiconductors can be implemented various colors such as blue, red, green, and ultraviolet light. In addition, it is possible to implement highly efficient white light rays by using fluorescent materials or by combining colors. In addition, it has advantages of low power consumption, semi-permanent life, fast response speed, safety and environmental friendliness compared to conventional light sources such as fluorescent lamps and incandescent lamps.

In addition, when light-receiving devices such as photodetectors and solar cells are also manufactured using compound semiconductor materials of Groups III-V or II-VI of semiconductors, the development of device materials generates photocurrent by absorbing light in various wavelength ranges. By doing so, light in various wavelength ranges from gamma rays to radio wavelength ranges can be used. In addition, it has the advantages of fast response speed, safety, environmental friendliness, and easy control of device materials, so it can be easily used for power control or ultra-high frequency circuits or communication modules.

Accordingly, a light-emitting diode backlight is replacing a cold cathode fluorescent lamp (CCFL) constituting a transmission module of an optical communication means and a backlight of a liquid crystal display (LCD) display device. Applications are expanding to white light-emitting diode lighting devices that can replace fluorescent or incandescent bulbs, automobile headlights and traffic lights, and sensors that detect gas or fire.

In addition, applications can be extended to high-frequency application circuits, other power control devices, and communication modules. For example, in the conventional semiconductor light source device technology, there is a vertical-cavity surface emitting laser (VCSEL), which is used for optical communication, optical parallel processing, and optical connection. On the other hand, in the case of a laser diode used in such a communication module, it is designed to operate at a low current.

Surface emitting laser devices are being developed for communication and sensors. Surface emitting laser devices for communication are applied to optical communication systems.

The surface emitting laser device for sensors is applied to 3D sensing cameras that recognize human faces. For example, a 3D sensing camera is a camera capable of capturing depth information of an object, and has recently been in the spotlight in conjunction with augmented reality.

Surface emitting laser devices are mounted on a substrate and commercialized as surface emitting laser devices. In this case, an electrode that is disposed under the surface emitting laser device and includes Au is fixed to the substrate by a bonding process using a metal paste material.

However, in a conventional surface emitting laser device, product defects in which Ag of the electrode is separated from the substrate due to weak bonding strength with a metal paste material are frequently problematic. In particular, the metal of the electrode must be electrically connected to the substrate to receive a signal. However, when the electrode metal is separated from the substrate or partially contacted, since the signal is not completely transmitted to the surface emitting laser device, electrical characteristics cannot be obtained properly.

DISCLOSURE

Technical Problem

The objects of embodiment are to solve the above problems and other problems.

Another object of the embodiment is to provide a surface emitting laser device and a surface emitting laser apparatus having the same capable of improving electrical properties by enhancing bonding force.

Another object according to the embodiment is to provide a surface emitting laser device and a surface emitting laser apparatus having the same capable of improving ohmic characteristics.

Another object according to the embodiment is to provide a surface emitting laser device and a surface emitting laser apparatus having the same capable of improving electrical properties by preventing oxidation.

Another object according to the embodiment is to provide a surface emitting laser device and a surface emitting laser apparatus having the same capable of improving electrical properties by enhancing adhesion between layers.

Technical Solution

According to embodiments to achieve the above or other object, the surface emitting laser device includes a substrate; a first metal layer disposed on the substrate; a second metal layer disposed on the first metal layer; and a third metal layer disposed between the first metal layer and the second metal layer. The first to third metal layers may include different materials, and the second metal layer may include copper (Cu). The third metal layer may prevent diffusion of copper from the second metal layer into the first metal layer.

According to another aspect of the embodiment, a surface emitting laser apparatus includes: a first substrate; a surface emitting laser device disposed on the first substrate; and a solder layer disposed between the first substrate and the surface emitting laser device.

The surface emitting laser device may include a second substrate; a first metal layer disposed under the second substrate; a second metal layer disposed between the first metal layer and the solder layer; and a third metal layer disposed between the first metal layer and the second metal layer.

The first to third metal layers may include different materials, and the second metal layer may include copper (Cu). The third metal layer may prevent diffusion of copper from the second metal layer into the first metal layer.

Advantageous Effects

The effect of the surface emitting laser device according to the embodiment will be described as follows.

According to at least one of the embodiments, a first metal layer containing copper (Cu) is used as a bonding layer in the first electrode disposed under the surface emitting laser device, and the first metal layer has a bonding force with the solder layer. As a result, there is an advantage in that the reliability of the product can be improved by preventing the separation of the first electrode of the surface emitting laser device from the substrate.

According to at least one of the embodiments, the third metal layer, which is a barrier layer, is disposed between the first metal layer and the second metal layer in the first electrode disposed under the surface emitting laser device, so that the copper (Cu) particles of the first metal layer is not diffused into the second metal layer, thus improving the ohmic characteristics of the second metal layer.

According to at least one of the embodiments, in the first electrode disposed under the surface emitting laser device, the fourth metal layer is disposed on the lower surface of the first metal layer, thereby preventing oxidation of copper (Cu) of the first metal layer, thereby preventing electrical conductivity. So, there is an advantage that it can improve the electrical characteristics of the product by improving it.

According to at least one of the embodiments, the Cu particles of the fourth metal layer in the first electrode disposed under the surface emitting laser device are disposed on the lower surface of the first metal layer and/or inside the first metal layer. There is an advantage in that the electrical properties of the product can be improved by improving the electrical conductivity by preventing the oxidation of copper (Cu) in the metal layer.

According to at least one of the embodiments, the sixth metal layer is disposed between the first metal layer and the fifth metal layer in the first electrode disposed under the surface emitting laser device, thereby enhancing the adhesion between the first metal layer and the fifth metal layer. So, it has the advantage of improving reliability of products by preventing separation between metal layers.

Further scope of applicability of the embodiments will become apparent from the detailed description below. However, various changes and modifications within the spirit and scope of the embodiments may be clearly understood by those skilled in the art, and thus, specific embodiments such as detailed description and preferred embodiments should be understood as being given by way of example only.

DESCRIPTION OF DRAWINGS

FIG. 1 is a plan view showing a surface emitting laser device according to an embodiment.

FIG. 2 is a cross-sectional view taken along line X1-X2 of the surface emitting laser device according to the embodiment.

FIG. 3 is a plan view of a surface emitting laser device according to an embodiment.

FIG. 4 is an enlarged view of a region C1 of the surface emitting laser device according to the embodiment illustrated in FIG. 3.

FIG. 5A is a first cross-sectional view taken along line A1-A2 of the surface emitting laser device according to the embodiment shown in FIG. 4.

FIG. 5B is a second cross-sectional view taken along line A3-A4 of the surface emitting laser device according to the embodiment shown in FIG. 5A.

FIG. 6 shows a detailed structure of the first electrode according to the first embodiment.

FIG. 7 shows the bonding strength for various metallic materials.

FIGS. 8a and 8b show a surface emitting laser device separated from a substrate in a comparative example.

FIGS. 9a and 9b show a state in which the surface emitting laser device is separated from the substrate in the embodiment.

FIG. 10 shows a detailed structure of the first electrode according to the second embodiment.

FIG. 11 shows a detailed structure of the first electrode according to the third embodiment.

FIG. 12 shows a detailed structure of the first electrode according to the fourth embodiment.

FIG. 13 shows a detailed structure of the first electrode according to the fifth embodiment.

FIG. 14 shows a detailed structure of the first electrode according to the sixth embodiment.

FIG. 15 shows a detailed structure of the first electrode according to the seventh embodiment.

FIG. 16 is a cross-sectional view illustrating an example of a second electrode according to the embodiment shown in FIG. 3A.

FIG. 17(a) and FIG. 17(b) are diagrams illustrating a work function of a second electrode according to the related art and the embodiment.

FIG. 18 shows V-I characteristics of a surface emitting laser device according to the prior art and the embodiment.

FIG. 19 is a cross-sectional view illustrating another example of a second electrode according to the embodiment.

FIG. 20 is a plan view illustrating a first metal layer of a second electrode according to an exemplary embodiment.

FIG. 21 is a cross-sectional view of a flip chip type surface emitting laser device according to an embodiment.

FIG. 22 is a perspective view of a mobile terminal to which a surface emitting laser device is applied according to an embodiment.

MODE FOR INVENTION

Hereinafter, preferred embodiments of the present invention will be described in detail with reference to the accompanying drawings. However, the technical idea of the present invention is not limited to some embodiments to be described, but may be implemented in various different forms, and within the scope of the technical idea of the present invention, one or more of the constituent elements may be selectively selected between the embodiments. It can be combined with and substituted for use. In addition, terms (including technical and scientific terms) used in the embodiments of the present invention are generally understood by those of ordinary skill in the art, unless explicitly defined and described. It can be interpreted as a meaning, and terms generally used, such as terms defined in a dictionary, may be interpreted in consideration of the meaning in the context of the related technology. In addition, terms used in the embodiments of the present invention are for describing the embodiments and are not intended to limit the present invention. In the present specification, the singular form may also include the plural form unless specifically stated in the phrase, and may be combined into A, B, and C when described as "at least one (or more than one) of and C" and it may contain one or more of all combinations. In addition, terms such as first, second, A, B, (a), and (b) may be used in describing the constituent elements of the embodiment of the present invention. These terms are only for distinguishing the component from other components, and are not limited to the nature, order, or order of the component by the term. And, if a component is described as being 'connected', 'coupled' or 'contacted' to another component, the component can be directly connected to the other component, and may include not only the case of being coupled or connected, but also the case of being 'connected', 'coupled', or 'contacted' due to another element between the element and the other element. In addition, when it is described as being formed or disposed in the "top (up) or bottom (low)" of each component, the top (up) or bottom (low) is one as well as when the two components are in direct contact with each other. It also includes the case where the above other component is formed or disposed between the two components. In addition, when expressed as "upper (above) or lower (below)", the meaning of not only an upward direction but also a downward direction based on one component may be included.

FIG. 1 is a plan view showing a surface emitting laser device according to an embodiment, and FIG. 2 is a cross-sectional view taken along line X1-X2 of the surface emitting laser device according to the embodiment.

Referring to FIGS. 1 and 2, a surface emitting laser apparatus 100 according to an embodiment may include a substrate 110 and a plurality of surface emitting laser devices 201 mounted on the substrate 110. For example, the surface emitting laser apparatus 100 according to the embodiment may be of a chip on board (COB) type, but is not limited thereto. A plurality of surface emitting laser devices 201 are mounted on the substrate 110 so that the plurality of surface emitting laser devices 201 are selectively or collectively emit light, so that the intensity of the laser beam can be adjusted.

The detailed structure of the surface emitting laser device 201 is shown in FIGS. 3 to 5, which will be described in detail later.

The substrate 110 may be a printed circuit substrate (PCB), and may be a flexible substrate or a rigid substrate.

The substrate 110 includes a base substrate 111, a first conductive pattern 113 and a second conductive pattern 115 disposed on the base substrate 111, and may include a solder resist 117 disposed on the first conductive pattern 113 and the second conductive pattern 115.

The base substrate 111 is necessary for forming the first conductive pattern 113 and the second conductive pattern 115, and also serves to support the first conductive pattern 113 and the second conductive pattern 115. The base substrate 111 may be made of, for example, paper, resin, glass, or the like.

The first conductive pattern 113 and the second conductive pattern 115 may be disposed to be spaced apart from each other for electrical insulation. The first conductive pattern 113 and the second conductive pattern 115 may be formed on the same surface, that is, on the upper surface of the base substrate 111. The first conductive pattern 113 and the second conductive pattern 115 may be lines through which a signal can flow.

The solder resist may be a protective layer that physically protects the first conductive pattern 113 and the second conductive pattern 115 from the outside, and may be an insulating layer that prevents from the first conductive pattern 113 and the second conductive pattern 115 being electrically shorted to the outside.

The solder resist may be partially removed so that a portion of the upper surfaces of each of the first conductive pattern 113 and the second conductive pattern 115 may be exposed to the outside. For example, an exposed portion of the first conductive pattern 113 is electrically connected to a lower portion of the surface emitting laser device 201, and an exposed portion of the second conductive pattern 115 is an upper portion of the surface emitting laser device 201.

In addition, the lower portion of the surface emitting laser device 201 may be fixed to the exposed portion of the first conductive pattern 113 by a die bonding method using a silver paste. The metal paste may be cured to form the solder layer 120.

The surface emitting laser device 201 includes a surface emitting laser emitting layer 205, a first electrode 215 disposed on a lower surface of the surface emitting laser emitting layer 205, and a second electrode 282 disposed on the upper surface of the surface emitting laser emitting layer 205. The surface emitting laser device 201 may include a plurality of emitters (see E1, E2, E3 in FIG. 4) from which a laser beam is emitted.

In FIG. 2, only one emitter structure is shown for convenience of description, but as shown in FIG. 3, the surface emitting laser device 201 includes hundreds of emitters, and a laser beam is transmitted from each of these emitters and can be released to the outside. These emitters can be placed spaced apart from each other. A second electrode may be disposed on the upper surface of the surface emitting laser emission layer corresponding to between the emitters. The second electrode disposed between the emitters may be integrally formed. The second electrode may be a signal supply source that supplies a signal to the laser emission layer, and may be a blocking layer that prevents the laser beam from being emitted to the outside.

Although not shown, a passivation layer (see 270 in FIG. 5A) is disposed on the side of the surface emitting laser device 201 such that it physically protects and electrically insulate the surface emitting laser emitting layer 205 from the outside.

The first electrode 215 of the surface emitting laser device 201 may be electrically connected to the first conductive pattern 113 of the substrate 110 by the solder layer 120. In addition, the first electrode 215 of the surface emitting laser device 201 may be fixed to the first conductive pattern 113 of the substrate 110 by the solder layer 120. The solder layer 120 may be disposed between the lower surface of the first electrode 215 of the surface emitting laser device 201 and the upper surface of the first conductive pattern 113 of the substrate 110. The solder layer 120 may be disposed between a side surface of the first electrode 215 of the surface emitting laser device 201 and a portion of an inner side and an upper surface of the solder resist. A part of the solder resist may be removed to expose a part of the upper surface of the first conductive pattern 113. It may mean an inner surface of an opening from which a part of the solder resist is removed from the inner surface of the solder resist. A portion of the upper surface of the solder resist may be a region adjacent to an opening from which a portion of the solder resist has been removed.

The thickness of the solder layer 120 may be 15 μm to 50 μm. When the thickness of the solder layer 120 is less than 15 μm, a defective attachment to the first electrode 215 and the substrate 110 may occur. When the thickness of the solder layer 120 is greater than 50 μm, the thickness of the surface emitting laser device 100 may be increased.

Considering the die bonding method using a metal paste, the metal paste may be firstly dropped onto the first conductive pattern 113 of the substrate 110 by a dotting method. Since the metal paste has viscosity, it may have a semicircular shape or an elliptical shape on the first conductive pattern 113 of the substrate 110. Thereafter, the surface emitting laser device 201 may be positioned on the metal paste. Thereafter, by applying heat and pressing the surface light emitting laser device 201 downward, the first electrode 215 of the surface light emitting device is transferred to the first conductive pattern 113 of the substrate 110 via the solder layer 120 and can be electrically connected. The applied heat may be between 180° C. and 220° C.

Although not shown, the solder layer 120 may not exist between the lower surface of the second electrode of the surface emitting laser device 201 and the upper surface of the first conductive pattern 113 of the substrate 110. In this case, the lower surface of the second electrode of the surface emitting laser device 201 directly contacts the upper surface of the first conductive pattern 113 of the substrate 110, and the solder layer 120 is formed of the surface emitting laser device 201 and may be disposed around the side of the electrode 215. That is, the second electrode of the surface emitting laser device 201 is directly electrically connected to the top surface of the first conductive pattern 113 of the substrate 110, and the first electrode 215 of the surface emitting laser device 201 may be fixed to the first conductive pattern 113 of the substrate 110 by the solder layer 120 disposed around the side surface.

Although not shown, a passivation layer may be disposed on the side surface of the surface emitting laser emission layer 205. A part of the solder resist may come into contact with the passivation layer corresponding to the lower region of the surface emitting laser emission layer 205 positioned above the first metal layer.

Meanwhile, the second electrode of the surface emitting laser device 201 may be electrically connected to the second conductive pattern 115 of the substrate 110 by using a wire bonding method. That is, one side of the wire 285 may be electrically connected to the second electrode of the surface emitting laser device 201, and the other side of the wire 285 may be electrically connected to the second conductive pattern 115 of the substrate 110.

In the surface emitting laser apparatus 100 configured as described above, signals from the first conductive pattern 113 and the second conductive pattern 115 pass through the first electrode 215 and the second electrode, and the surface emitting laser emission layer 205, the laser beam can be emitted to the outside from each of the plurality of emitters.

The surface emitting laser device according to the embodiment will be described in detail with reference to FIGS. 3 to 5.

FIG. 3 is a plan view of a surface emitting laser device according to an embodiment, and FIG. 4 is an enlarged view of a region C1 of the surface emitting laser device according to the embodiment shown in FIG. 3. FIG. 5A is a first cross-sectional view taken along line A1-A2 of the surface emitting laser device according to the embodiment shown in FIG. 4, and FIG. 5B is a second cross-sectional view taken along line A3-A4 of the surface emitting laser device according to the embodiment shown in FIG. 4.

Referring to FIGS. 3 to 5B, the surface emitting laser device 201 according to the embodiment may include a light-emitting portion E and a pad portion P. As shown in FIG. 4, the light-emitting unit E may be a region in which a laser beam is emitted as a region including a plurality of light-emitting emitters E1, E2, and E3. For example, the light emitting unit E may include tens to hundreds of light emitting emitters. The pad portion P may be disposed on a region where the light emitting emitters E1, E2, and E3 are not disposed.

The surface emitting laser device 201 according to the embodiment may include a second electrode 282 defining an opening. That is, in each of the light emitting emitters E1, E2, and E3, the second electrode 282 may be disposed in a region other than the region corresponding to the aperture 241. For example, the second electrode 282 may be disposed in the second region of the second reflective layer 250. The first area of the second reflective layer 250 is surrounded by the second area, and may be the same as or larger than the size of the aperture 241. Accordingly, the beam generated in the emission layer 230 may pass through the aperture 241 and be emitted to the outside through an opening defined by the second electrode 282.

The surface emitting laser device 201 according to the embodiment includes a surface emitting laser emitting layer 205, a first electrode 215 disposed on a lower surface of the surface emitting laser emitting layer 205, and a second electrode 282 disposed on an upper surface of the surface emitting laser emitting layer 205.

The surface emitting laser emission layer 205 may include any one or more of a substrate 210, a first reflective layer 220, a light emitting layer 230, an oxide layer 240, a second reflective layer 250, and a passivation layer 270.

The oxide layer 240 may include an aperture 241 and an insulating region 242. The aperture 241 may be a passage area through which current flows. The insulating region 242 may be a blocking region that blocks the flow of current. The insulating region 242 may be referred to as an oxide layer or an oxidation layer.

The surface emitting laser device 201 according to the embodiment may further include a pad electrode 280. The pad electrode 280 may be disposed in a pad portion P where the light emitting portion E is not disposed. The pad electrode 280 may be electrically connected to the second electrode 282. The second electrode 282 and the pad electrode 280 may be formed integrally or may be formed separately.

Hereinafter, technical features of the surface emitting laser device 201 according to the embodiment will be described with reference to FIGS. 3 to 5. In the drawings of the embodiment, the x-axis direction may be a direction parallel to a length direction of the substrate 210, and the y-axis may be a direction perpendicular to the x-axis.

<Substrate, First Electrode>

The surface emitting laser device 201 according to the embodiment provides a substrate 210. The substrate 210 may be a conductive substrate. A metal having excellent electrical conductivity may be used as the conductive substrate. Since heat generated during the operation of the surface emitting laser device 201 can be sufficiently dissipated, a GaAs substrate or a metal substrate having high thermal conductivity may be used as the conductive substrate, or a silicon (Si) substrate may be used.

The surface emitting laser device 201 according to the embodiment provides a first electrode 215. The first electrode 215 may be disposed under the substrate 210. The first electrode 215 may be formed of a conductive material and may be disposed in a single layer or multiple layers. For example, the first electrode 215 may be a metal, and includes at least one of aluminum (Al), titanium (Ti), chromium (Cr), nickel (Ni), copper (Cu), and gold (Au) and can be formed in a single-layer or multi-layered structure, thereby improving the electrical characteristics and increasing the light output.

<First Reflective Layer>

The surface emitting laser device 201 according to the embodiment provides a first reflective layer 220. The first reflective layer 220 may be disposed on the substrate 210. When the substrate 210 is omitted to reduce the thickness, the lower surface of the first reflective layer 220 may contact the upper surface of the first electrode 215.

The first reflective layer 220 may be doped with a first conductivity type dopant. For example, the first conductivity-type dopant may include an n-type dopant such as Si, Ge, Sn, Se, and Te.

The first reflective layer 220 may include a gallium-based compound, for example, AlGaAs, but is not limited thereto. The first reflective layer 220 may be a Distributed Bragg Reflector (DBR). For example, the first reflective layer 220 may have a structure in which a first layer and a second layer including materials having different refractive indices are alternately stacked at least once or more.

For example, the first reflective layer 220 may include a plurality of layers disposed on the substrate 210. Each layer may contain a semiconductor material having a composition formula of $Al_xGa_{(1-x)}As(0<x<1)$, and when Al in each layer increases, the refractive index of each layer decreases, and when Ga increases, the refractive index of the layer can be increased. The thickness of each layer may be λ, λ may be a wavelength of light generated from the light emitting layer 230, and n may be a refractive index of each layer with respect to the light of the above-described wavelength. Here, λ may be 650 to 980 nanometers (nm), and n may be the refractive index of each layer. The first reflective layer 220 having this structure may have a reflectance of 99.999% for light having a wavelength of about 940 nanometers.

The thickness of the layer in each of the first reflective layers 220 may be determined according to a respective refractive index and a wavelength λ of light emitted from the light emitting layer 230.

<Emission Layer>

The surface emitting laser device 201 according to the embodiment may include an emission layer 230. The emission layer 230 may be disposed on the first reflective layer 220. Specifically, the emission layer 230 may be disposed on the first reflective layer 220. The emission layer 230 may be disposed between the first reflective layer 220 and the second reflective layer 250.

The emission layer 230 may include an active layer and at least one or more cavities. For example, the emission layer 230 may include an active layer, a first cavity disposed below the active layer, and a second cavity disposed above the active layer. The light emitting layer 230 of the embodiment may include both the first cavity and the second cavity, or may include only one of the two.

The active layer may include any one of a single well structure, a multiple well structure, a single quantum well structure, a multi quantum well (MQW) structure, a quantum dot structure, or a quantum wire structure.

The active layer may include a quantum well layer and a quantum wall layer using a Group 3-5 or 2-6 compound semiconductor material. The quantum well layer may be formed of a material having an energy band gap smaller than the energy band gap of the quantum wall layer. The active layer may be formed in 1 to 3 pair structure such as InGaAs/AlxGaAs, AlGaInP/GaInP, AlGaAs/AlGaAs, AlGaAs/GaAs, GaAs/InGaAs, but is not limited thereto. The active layer may not be doped with a dopant.

The first cavity and the second cavity may be formed of an $Al_yGa_{(1-y)}As(0<y<1)$ material, but are not limited thereto. For example, the first cavity and the second cavity may each include a plurality of layers of $Al_yGa_{(1-y)}As$.

<Oxide Layer>

The surface emitting laser device according to the embodiment may provide an oxide layer 240. The oxide layer 240 may include an insulating region 242 and an aperture 241. The insulating region 242 may surround the aperture 241. For example, the aperture 241 may be disposed on a first area (center area) of the emission layer 230, and the insulating area 242 may be disposed on a second area (edge area) of the emission layer 230. The second area may surround the first area.

The aperture 241 may be a passage area through which current flows. The insulating region 242 may be a blocking region that blocks the flow of current. The insulating region 242 may be referred to as an oxide layer or an oxidation layer.

The amount of current supplied from the second electrode 282 to the emission layer 230, that is, a current density, may be determined by the size of the aperture 241. The size of the aperture 241 may be determined by the insulating region 242. As the size of the insulating region 242 increases, the size of the aperture 241 decreases, and accordingly, the current density supplied to the emission layer 230 may increase. In addition, the aperture 241 may be a path through which the beam generated by the emission layer 230 travels upward, that is, in the direction of the second reflective layer 250. That is, depending on the size of the aperture 241, the divergence angle of the beam of the emission layer 230 may vary.

The insulating region 242 may be formed of an insulating layer, for example, aluminum oxide ($Al_2O_3$). For example, when the oxide layer 240 includes aluminum gallium arsenide (AlGaAs), the AlGaAs of the oxide layer 240 reacts with $H_2O$ and the edge changes to aluminum oxide ($Al_2O_3$) may be an insulating region 242, and the central region that does not react with $H_2O$ may be the aperture 241 including AlGaAs.

According to the embodiment, light emitted from the light emitting layer 230 through the aperture 241 may be emitted to the upper region, and the aperture 241 may have excellent light transmittance compared to the insulating region 242.

The insulating region 242 may include a plurality of layers. For example, the insulating region 242 is disposed between a first insulating region, a second insulating region disposed on the first insulating region, and a third insulating region on the second insulating region. One insulating region among the first to third insulating regions may have the same thickness as the other insulating region or may have a different thickness. The first to third insulating regions may include at least an oxidation material. The first to third insulating regions may include at least a Group 3-5 or 2-6 compound semiconductor material.

<Second Reflective Layer>

The surface-emission laser device according to the embodiment may include a second reflective layer 250. The second reflective layer 250 may be disposed on the oxide layer 240.

The second reflective layer 250 may include a gallium-based compound, for example, AlGaAs, and the second reflective layer 250 may be doped with a second conductivity type dopant. The second conductivity-type dopant may be a p-type dopant such as Mg, Zn, Ca, Sr, Ba, or the like. Meanwhile, the first reflective layer 220 may be doped with a p-type dopant, or the second reflective layer 250 may be doped with an n-type dopant.

The second reflective layer 250 may also be a Distributed Bragg Reflector (DBR). For example, the second reflective layer 250 may have a structure in which a plurality of layers including materials having different refractive indices are alternately stacked at least once or more.

Each layer of the second reflective layer 250 may include AlGaAs, and in detail, may be made of a semiconductor material having a composition formula of $Al_xGa_{(1-x)}As$ (0<x<1). Here, when Al increases, the refractive index of each layer decreases, and when Ga increases, the refractive index of each layer may increase. The thickness of each layer of the second reflective layer 250 is λ, λ may be the wavelength of light emitted from the active layer, and n may be the refractive index of each layer with respect to the above-described light.

The second reflective layer 250 having this structure may have a reflectance of 99.9% for light having a wavelength of about 940 nanometers.

The second reflective layer 250 may be formed by alternately stacking layers, and the number of pairs of layers in the first reflective layer 220 may be greater than the number of pairs of layers in the second reflective layer 250. As described above, the reflectance of the first reflective layer 220 is 99.999%, which may be greater than the reflectance of 99.9% of the second reflective layer 250.

In an embodiment, the second reflective layer 250 may include a plurality of layers disposed on the emission layer 230. Each layer may be formed of a single layer or a plurality of layers.

<Passivation Layer, Second Electrode>

The surface emitting laser device according to the embodiment may provide a passivation layer 270. The passivation layer 270 may surround a portion of the light emitting structure. Some regions of the light emitting structure may include, for example, the light emitting layer 230, the oxide layer 240, and the second reflective layer 250. The passivation layer 270 may be disposed on the upper surface of the first reflective layer 220. The passivation layer 270 may be disposed on the edge region of the second reflective layer 250. When the light emitting structure is partially mesa etched, a part of the upper surface of the first reflective layer 220 may be exposed, and a partial region of the light emitting structure may be formed. The passivation layer 270 may be disposed around a portion of the light emitting structure and on the exposed top surface of the first reflective layer 220.

The passivation layer 270 may protect the light emitting structure from the outside and may block an electrical short between the first reflective layer 220 and the second reflective layer 250. The passivation layer 270 may be formed of an inorganic material such as $SiO_2$, but is not limited thereto.

The surface emitting laser device according to the embodiment may provide a second electrode 282. The second electrode 282 may be electrically connected to the pad electrode 280. The second electrode 282 may contact a portion of the upper surface of the second reflective layer 250.

The second electrode 282 and the pad electrode 280 may be made of a conductive material. For example, the second electrode 282 and the pad electrode 280 may be formed in a single-layer or multi-layered structure including at least one of platinum (Pt), aluminum (Al), titanium (Ti), chromium (Cr), nickel (Ni), tungsten (W), copper (Cu).) and gold (Au).

Hereinafter, various embodiments of the first electrode 215 (first to seventh embodiments) will be described in detail.

The order of the first to seventh metal layers 215_1 to 215_7 described in the first to seventh embodiments can be changed. For example, the first metal layer 215_1 may be referred to as a third metal layer 2153, and the fifth metal layer 215_5 may be referred to as a second metal layer 215_2.

First Embodiment

As described above, the first electrode 215 of the surface light emitting laser device may be bonded to the first conductive pattern 113 of the substrate 110 by a die bonding method using the solder layer 120.

In order for the first electrode 215 to be strongly fixed to the first conductive pattern 113 of the substrate 110, the first electrode 215 can have a strong bonding force with the solder layer 120.

FIG. 7 shows bonding strength when silver (Ag), gold (Au), copper (Cu), or the like is used as the bonding layer of the first electrode.

As shown in FIG. 7, it can be seen that silver (Ag) has stronger bonding strength than gold (Au) in bonding strength to a metal paste, and copper (Cu) has a bonding strength more than silver (Ag).

FIG. 6 shows a detailed structure of the first electrode according to the first embodiment.

Referring to FIG. 6, the first electrode 215A according to the first embodiment may include a first metal layer 215_1 and a second metal layer 215_2 disposed on the first metal layer 2151.

The first metal layer 215_1 is a bonding layer, and the first electrode 215A may be fixed to the first conductive pattern 113 of the substrate 110 with a strong bonding force. For example, the first metal layer 215_1 may include copper (Cu), but is not limited thereto.

As shown in FIG. 7, among silver (Ag), gold (Au), and copper (Cu), the bonding strength of copper (Cu) to the metal paste is the greatest.

Therefore, since the first metal layer 2151 including copper (Cu) is used as a bonding layer, and the first metal layer 215_1 has excellent bonding strength with the solder layer 120, the first electrode 215A can be firmly fixed to the first conductive pattern 113 of the substrate 110, it is possible to improve the reliability of the product by preventing the first electrode 215A of the surface emitting laser device 201 from being separated from the substrate 110.

FIG. 8 shows a state in which the surface emitting laser device was separated from the substrate in the comparative example, and gold (Ag) was used as a bonding layer of the first electrode of the surface emitting laser device. FIG. 9 shows a state in which the surface emitting laser device is separated from the substrate in the embodiment, and as in the first embodiment, copper (Cu) was used as a bonding layer of the first electrode of the surface emitting laser device.

In order to test the bonding strength of the first electrode of the surface emitting laser device, as shown in FIGS. 8 and 9, the first electrode of the surface emitting laser device was forcibly separated from the substrate.

According to the comparative example, the lower surface of the first electrode of the surface-emitting laser device has almost no solder layer and a bonding layer (yellow portion) containing gold (Cu) is seen (FIG. 8A). However, the solder layer remains on the surface (gray part) of the substrate (FIG. 8B). From this, it can be seen that the first electrode of the surface-emitting laser device of the comparative example has poor bonding strength with the solder layer.

In contrast, according to the embodiment, the solder layer 120 remains both on the lower surface (FIG. 9A) of the first electrode 215A of the surface emitting laser device 201 and the surface of the substrate 110 (FIG. 9B). Referring to 9A and 9B, more of the solder layer 120 remains on the lower surface of the first electrode 215A of the surface emitting laser device 201 (FIG. 9A) than the surface of the substrate 110 (FIG. 9B). From this, it can be seen that the first electrode 215A of the surface emitting laser device 201 according to the embodiment has excellent bonding strength with the solder layer 120.

The bonding strength (DST) of the comparative example (FIG. 8) is about 198, whereas the bonding strength (DST) of the embodiment (FIG. 9) can be obtained at least 950 or more.

Although not shown, during the test for the embodiment, while the first electrode 215A of the surface emitting laser device 201 is forcibly separated from the solder layer 120, the first electrode 215A of the surface emitting laser device 201 can be partially damaged. As the first electrode 215A of the surface emitting laser device 201 is forcibly separated from the bonded state with the solder layer 120, the first electrode 215A may be damaged. Such damage is caused by the bonding force between the first metal layer 2151 including copper (Cu) among the first electrodes 215A of the surface-emitting laser device 201 of the embodiment and the solder layer 120 being greater than the force pulled from the substrate 110.

Meanwhile, the second metal layer 215_2 is an ohmic layer, and may improve ohmic characteristics with the surface emitting laser emission layer 205. That is, the second metal layer 215_2 may improve the ohmic characteristics of the surface emitting laser emission layer 205 with the substrate 110. The second metal layer 215_2 may include AuGe, AuNi, nickel (Ni), palladium (Pd), or the like, but is not limited thereto.

According to the first embodiment, a first electrode 215A provided under the surface emitting laser device 201 and including a bonding layer containing copper (Cu) was mounted on the substrate 110 and was tested for electrical properties.

Second Embodiment

According to the first embodiment, the first electrode 215A may include the first metal layer 2151 and the second metal layer 215_2, and the second metal layer 2152 may contact the first metal layer 215_1. Copper (Cu) may be included in the first metal layer 215_1, and the copper (Cu) may penetrate into the second metal layer 215_2 by diffusion in the form of particles by high heat during the die bonding process. As described above, when the second metal layer 2152 contains copper (Cu) particles, the ohmic characteristics of the second metal layer 215_2 may be deteriorated.

FIG. 10 shows a detailed structure of the first electrode according to the second embodiment.

Referring to FIG. 10, a first electrode 215B according to the second embodiment includes a first metal layer 215_1, a second metal layer 215_2, and a third metal layer 215_3 included between the first metal layer 215_1 and the second metal layer 215_2.

The third metal layer 215_3 may be a barrier layer that prevents diffusion of copper (Cu) particles of the first metal layer 215_1 into the second metal layer 2152. For example, the third metal layer 215_3 may include nickel (Ni), platinum (Pt), tungsten (W), and TiW, but is not limited thereto.

Accordingly, the third metal layer 2153, which is a barrier layer, is disposed between the first metal layer 215_1 and the second metal layer 215_2, so that the copper (Cu) particles of the first metal layer 215_1 is not diffused into the second metal layer 215_2, ohmic characteristics of the second metal layer 215_2 may be improved.

Third Embodiment

In the first or second embodiment, when the first metal layer 215_1 contains copper (Cu) and is exposed to the outside, oxygen ($O_2$) in the air is provided on the lower surface of the first metal layer 215_1 exposed to the outside. A layer made of copper oxide ($Cu_2O_3$) may be formed by bonding with copper (Cu). The layer made of copper oxide ($Cu_2O_3$) has insulating properties. In this case, when the first metal layer 215_1 provided with a layer made of copper oxide ($Cu_2O_3$) is electrically connected to the first conductive pattern 113 of the substrate 110 using the solder layer 120, the electrical conductivity of the second electrode may decrease due to the insulating property of the layer made of copper oxide ($Cu_2O_3$).

FIG. 11 shows a detailed structure of the first electrode according to the third embodiment.

In the third embodiment, the first to third metal layers 215_1 to 215_3 of the first electrode 215C may be the same as in the second embodiment.

The first electrode 215C according to the third embodiment may include a fourth metal layer 215_4 disposed on a lower surface of the first metal layer 2151. The fourth metal layer 2154 is an antioxidant layer, and may prevent oxidation of copper (Cu) included in the first metal layer 215_1, thereby improving electrical conductivity. For example, the fourth metal layer 215_4 may include gold (Au), platinum (Pt), tungsten (W), but is not limited thereto.

As shown in Table 1 below, since the fourth metal layer 215_4 needs to prevent oxidation of copper (Cu) included in the first metal layer 2151, it may have a very thin thickness.

Therefore, since the fourth metal layer 215_4 is disposed on the lower surface of the first metal layer 215_1, the oxidation of copper (Cu) of the first metal layer 215_1 is prevented to improve electrical conductivity, thereby improving the electrical characteristics of the product.

Fourth Embodiment

The fourth embodiment is a modification of the third embodiment, and gold (Au) particles included in the fourth metal layer 215_4 may be included in the first metal layer 2151. When the copper (Cu) of the first metal layer 215_1 is exposed to the outside, insulating properties due to oxidation may be strengthened and electrical conductivity may be reduced. A metal layer may be added to prevent this decrease in electrical conductivity.

FIG. 12 shows a detailed structure of the first electrode according to the fourth embodiment.

In the fourth embodiment, the first to third metal layers 215_1 to 215_3 of the first electrode 215D may be the same as those of the first to third embodiments.

The first electrode 215D according to the fourth embodiment may include a fourth metal layer 215_4 disposed under the first metal layer 215_1.

The fourth metal layer 215_4 is an antioxidant layer, and may prevent oxidation of copper (Cu) included in the first metal layer 215_1, thereby improving electrical conductivity. For example, the fourth metal layer 215_4 may include gold (Au), but is not limited thereto.

According to the fourth embodiment, the gold (Au) particles 216 included in the fourth metal layer 215_4 may be disposed on the lower surface of the first metal layer 215_1. Gold (Au) particles 216 included in the fourth metal layer 215_4 may be included in the first metal layer 215_1. For example, the gold (Au) particles 216 included in the fourth metal layer 215_4 may be disposed adjacent to the lower surface of the first metal layer 2151. For example, the density of the gold (Au) particles 216 included in the fourth metal layer 215_4 may decrease as the distance from the lower surface of the first metal layer 2151 increases, that is, toward the upper direction.

The size of the gold (Au) particles 216 included in the fourth metal layer 215_4 or the interval between gold (Au) may be random.

The fourth metal layer 215_4 may be formed using, for example, a sputtering process. A sample made of gold (Au) particles may be placed, and a lower surface of the first metal layer 215_1 may be positioned opposite the sample. As ions collide with the sample by the sputtering process, gold (Au) particles are released from the sample and may be attached to the lower surface of the first metal layer 215_1. Some of the gold (Au) particles 216 adhered to the lower surface of the first metal layer 215_1 are very strong and may penetrate into the inside of the first metal layer 215_1 through the lower surface of the first metal layer 215_1. The fourth metal layer 215_4 positioned inside the lower surface of the first metal layer 215_1 and/or the first metal layer 215_1 may be formed by such a sputtering process.

Therefore, the gold (Cu) particles of the fourth metal layer 215_4 are disposed inside the lower surface of the first metal layer 2151 and/or the first metal layer 215_1, thereby preventing oxidation, it can improve the electrical conductivity and improve the electrical properties of the product.

Fifth Embodiment

In the first to fourth embodiments, the first metal layer 215_1 serves as a bonding layer, but another bonding layer may be added to enhance bonding performance.

FIG. 13 shows a detailed structure of the first electrode according to the fifth embodiment.

In the fifth embodiment, the first to third metal layers 215_1 to 215_3 of the first electrode 215E may be the same as those of the first to fourth embodiments.

The first electrode 215E according to the fifth embodiment may include a fifth metal layer 215_5 disposed between the first metal layer 2151 and the third metal layer 215_3.

Like the first metal layer 215_1, the fifth metal layer 215_5 may be a bonding layer. The fifth metal layer 215_5 may be an intermediate layer disposed between the first metal layer 215_1 and the third metal layer 215_3. The first metal layer 215_1 and the fifth metal layer 215_5 may include different metals. For example, the first metal layer 2151 may include copper (Cu), and the fifth metal layer 2155 may include gold (Au), but this is not limited thereto.

Sixth Embodiment

In the first to fifth embodiments, when the fifth metal layer 215_5 including gold (Cu) is disposed between the first metal layer 215_1 and the third metal layer 215_3, since copper (Cu) of the first metal layer 215_1 and gold (Cu) of the fifth metal layer 215_5 are not well bonded, another metal layer may be added.

FIG. 14 shows a detailed structure of the first electrode according to the sixth embodiment.

In the sixth embodiment, the first to third metal layers 215_1 to 215_3 of the first electrode 215F may be the same as those of the first to fifth embodiments.

The first electrode 215F according to the sixth embodiment may include a sixth metal layer 215_6 disposed between the first metal layer 2151 and the fifth metal layer 215_5.

The sixth metal layer 2156 is an adhesive, and improves adhesion between the copper (Cu) of the first metal layer 215_1 and the gold (Au) of the fifth metal layer 215_5, thereby enhancing the first metal layer 215_1 and the fifth metal layer 215_5. to be firmly bonded. For example, the sixth metal layer 215_6 may include titanium (Ti), palladium (Pd), chromium (Cr), but is not limited thereto.

Accordingly, by disposing the sixth metal layer 215_6 between the first metal layer 2151 and the fifth metal layer 2155, the adhesion between the first metal layer 215_1 and the fifth metal layer 215_5 can be strengthened to prevent separation between metal layers. Thus, the reliability of the product can be improved.

Seventh Embodiment

In the first to sixth embodiments, since the thermal stability between GeAu of the second metal layer 215_2 and nickel (Ni) of the third metal layer 215_3 is weak, a metal layer to compensate for this may be added.

FIG. 15 shows a detailed structure of the first electrode according to the seventh embodiment.

In the seventh embodiment, the first to third metal layers 2151 to 215_3 of the first electrode 215G may be the same as those of the first to sixth embodiments.

The first electrode 215G according to the seventh embodiment may include a seventh metal layer 215_7 disposed between the second metal layer 215_2 and the third metal layer 215_3. The seventh metal layer 2157 is for a pure metal finish design for the AuGe alloy of the second metal layer 215_2. The seventh metal layer 215_7 may be an intermediate layer disposed between the second metal layer 215_2 and the third metal layer 2153.

The seventh metal layer 215_7 is a thermally stable layer and enhances thermal stability between AuGe of the second metal layer 2152 and nickel (Ni) of the third metal layer 215_3 to prevent deterioration of electrical properties due to poor thermal stability. For example, the seventh metal layer 215_7 may include gold (Au), but is not limited thereto.

On the other hand, thicknesses of the first to seventh metal layers 215_1 to 215_7 included in the first electrodes 215A, 215B, 215C, 215D, 215E, 215F, 215G according to the first to seventh embodiments are shown in Table 1.

TABLE 1

| First electrode | Thickness (nm) |
| --- | --- |
| First metal layer (215_1) | $200 \leq T1 \leq 3000$ |
| Second metal layer (215_2) | $5 \leq T2 \leq 100$ |
| third metal layer (215_3) | $5 \leq T3 \leq 300$ |
| fourth metal layer (215_4) | $0.3 \leq T4 \leq 50$ |
| fifth metal layer (215_5) | $200 \leq T5 \leq 3000$ |
| sixth metal layer (215_6) | $5 \leq T6 \leq 100$ |
| seventh metal layer (215_7) | $5 \leq T7 \leq 30$ |

In the first metal layer 215_1, when the thickness T1 is less than 200 nm, the bonding force with the solder layer 120 may decrease, and when the thickness T1 is more than 3000 nm, the total thickness of the surface emitting laser device 201 can be increased. In the second metal layer 215_2, when the thickness T2 is less than 5 nm, the ohmic characteristics with the surface emitting laser emission layer 205 may be reduced, and when the thickness T2 is more than 100 nm, the total thickness of the surface emitting laser device 201 can be increased. In the third metal layer 2153, when the thickness T3 is less than 5 nm, copper (Cu) particles of the first metal layer 215_1 may still diffuse into the second metal layer 215_2, when the thickness T3 exceeds 300 nm, the total thickness of the surface emitting laser device 201 may be increased.

In the fourth metal layer 215_4, when the thickness T4 is less than 0.3 nm, copper (Cu) of the first metal layer 215_1 may be oxidized to reduce electrical properties, and when the thickness T4 is greater than 50 nm, the total thickness of the surface light emission device 201 can be increased.

In the fifth metal layer 2155, when the thickness T5 is less than 200 nm, the bonding property may be deteriorated, and when the thickness T5 is more than 3000 nm, the total thickness of the surface emitting laser device 201 may be increased.

In the sixth metal layer 2156, when the thickness T6 is less than 5 nm, the adhesive property may be deteriorated, and when the thickness T6 is more than 100 nm, the total thickness of the surface emitting laser device 201 may be increased.

In the seventh metal layer 2157, when the thickness T7 is less than 5 nm, thermal stability characteristics may be deteriorated, and when the thickness T7 is more than 30 nm, the total thickness of the surface emitting laser device 201 may be increased.

FIG. 16 is a cross-sectional view illustrating an example of a second electrode according to the embodiment shown in FIG. 3A.

In the second electrode 282 according to the embodiment, the second reflective layer 250 may be disposed on a partial area. For example, the second reflective layer 250 may include a first region and a second region surrounding the first region. The first region may be the same as or larger than the size of the aperture 241 of the oxide layer 240. In this case, the second electrode 282 may be disposed on the second area of the second reflective layer 250. The second electrode 282 may be electrically connected to the second region of the second reflective layer 250. The second electrode 282 may contact the second area of the second reflective layer 250. A partial region of the passivation layer 270 may be disposed on the first region of the second reflective layer 250. The second reflective layer 250 may be physically or electrically protected by a partial region of the passivation layer 270 disposed on the first region of the second reflective layer 250.

Referring to FIG. 16, the second electrode 282 may include a plurality of metal layers. The metal layer may include, for example, a first metal layer 282a, a second metal layer 282b, and a third metal layer 282c, but is not limited thereto.

The first metal layer 282a may be disposed on the second reflective layer 250. The first metal layer 282a may contact the upper surface of the second reflective layer 250. The first metal layer 282a may improve ohmic contact characteristics with the second reflective layer 250 to reduce contact resistance.

The first metal layer 282a may include a metal having a work function equal to or greater than the work function of the second reflective layer 250. The work function can be defined as the minimum energy required to remove free electrons from metal ions. For example, the second reflective layer 250 may include GaAs having a work function of less than about 5.5 eV. For example, the first metal layer 282a may include platinum (Pt) having a work function of less than about 5.65 eV, but is not limited thereto.

A ratio of the work function of the second reflective layer 250 and the work function of the first metal layer 282a of the second electrode 282 may be approximately 1:0.8 to approximately 1:1.2. For example, when the work function of the second reflective layer 250 is 5.5 eV, the work function of the first metal layer 282a of the second electrode 282 may be a metal having 4.4 eV to 6.6 eV.

When the ratio of the work function of the second reflective layer 250 and the work function of the first metal layer 282a of the second electrode 282 is less than 1:0.8 or greater than 1:1.2, the difference in the work function between the work function of the second reflective layer 250 and that of the first metal layer 282a of the second electrode 282 increases, so that contact resistance may increase.

FIG. 17(*a*) and FIG. 17(*b*) are diagrams illustrating a work function of a second electrode according to the related art and the embodiment.

As shown in FIG. 17(*a*) and FIG. 17(*b*), in the related art, the metal contacting the second reflective layer 250 is titanium (Ti), and the work function of titanium (Ti) may be less than 4.3 eV. When titanium (Ti) is in contact with the second reflective layer 250 as described above, the difference between the work function of the second reflective layer 250 and the work function of titanium (Ti) is 2.2 eV, which is large. Due to such a large work function difference, the contact resistance between the titanium (Ti) and the second reflective layer 250 increases, thereby obstructing the flow of current, and thus a high operating voltage should be applied to obtain light of high output power.

On the other hand, when the first metal layer 282a containing platinum (Pt) contacts the second reflective layer 250 as in the second embodiment, the work function of platinum (Pt) is slightly larger than the work function of the second reflective layer 250 because the work function of platinum (Pt) is less than 5.65 eV. That is, since the difference between the work function of platinum (Pt) and the work function of the second reflective layer 250 is less than 0.15 eV, there is a negligible difference, so that the contact resistance between the platinum (Pt) and the second reflective layer 250 is reduced. Since the current flow is smoothly, light of high output power can be emitted even when a low operating voltage is applied.

Referring to FIG. 18, V-I characteristics, contact resistance characteristics, and operating voltage characteristics of the surface emitting laser device according to the related art and the embodiment will be described.

As shown in FIG. 18, it can be seen that the V-I characteristics of the surface emitting laser device according to the embodiment are superior compared to the related art. For example, when a voltage of 1V is applied, a current of 0.1 A flows in the related art, whereas a current of 0.16 A may flow in the surface emitting laser device according to the embodiment. That is, for the same voltage, a larger current may flow in the surface emitting laser device according to the embodiment compared to the related art.

Meanwhile, the thickness of the first metal layer 282a may be approximately 5 nm to approximately 30 nm. When the thickness of the first metal layer 282a is less than 5 nm, it is difficult to form a uniform film. When the thickness of the first metal layer 282a is greater than 30 nm, the contact resistance can be increased.

According to the embodiment, the ratio of the work function of the second reflective layer 250 and the work function of the first metal layer 282a of the second electrode 282 is 1:0.8 to 1:1.2. Since the contact resistance is reduced because the work function of the first metal layer 282a of the second electrode 282 is similar to the work function of the second reflective layer 250, light having a greater output power may be emitted even at a smaller operating voltage.

According to the embodiment, by forming the first metal layer 282a of the second electrode 282 to be as thin as 5 nm to 30 nm, the contact resistance may be reduced and light of high output power may be emitted at a low operating voltage.

Referring back to FIG. 16, the second metal layer 282b may be disposed on the first metal layer 282a. For example, the second metal layer 282b may contact the upper surface of the first metal layer 282a, but this is not limited thereto.

The second metal layer 282b may serve to enhance an adhesive force between the first metal layer 282a and the third metal layer 282c and increase electrical conductivity to facilitate current flow. The metal layer may include at least one of titanium (Ti), nickel (Ni), and tungsten (W).

The thickness of the second metal layer 282b may be greater than the thickness of the first metal layer 282a. The thickness of the second metal layer 282b may be defined as a gap between a lower surface disposed on the second reflective layer 250 and an upper surface disposed below the third metal layer. The ratio of the thickness of the first metal layer 282a and the thickness of the second metal layer 282b may be approximately 1:3 to approximately 1:10. When the ratio of the thickness of the first metal layer 282a and the thickness of the second metal layer 282b is less than 1:3, adhesion may be weakened. When the ratio of the thickness of the first metal layer 282a and the thickness of the second metal layer 282b is greater than 1:10, the thickness may increase.

The third metal layer 282c may be disposed on the second metal layer 282b. For example, the third metal layer 282c may contact the upper surface of the second metal layer 282b, but this is not limited thereto.

The third metal layer 282c may serve to enhance bonding strength during wire bonding. For example, the third metal layer 282c may include gold (Au), but is not limited thereto.

The thickness of the third metal layer 282c may be equal to or greater than the thickness of the second metal layer 282b.

FIG. 19 is a cross-sectional view showing another example of a second electrode according to the embodiment, and FIG. 20 is a plan view showing a first metal layer of the second electrode according to the embodiment.

The embodiment is the same as the embodiment of FIG. 16 except that the first reflective layer of the second electrode 282 has nanodots. In the embodiment, components having the same function, shape and/or structure as in the embodiment of FIG. 16 are denoted by the same reference numerals, and detailed descriptions are omitted.

Referring to FIGS. 19 and 20, in the surface emitting laser device 201 according to the embodiment, a second electrode 282 may be disposed on the second reflective layer 250.

The second electrode 282 may include a plurality of metal layers. The metal layer may include, for example, a first metal layer 282a, a second metal layer 282b, and a third metal layer 282c, but is not limited thereto.

Since the second metal layer 282b and the third metal layer 282c have the same function, shape and/or structure as the second metal layer 282b and the third metal layer 282c described in the embodiment of FIG. 16, detailed description is omitted.

In an embodiment, the first metal layer 282a may have a nanodot structure. The nano-dot structure has a dot shape or a dot structure, and may mean a plurality of patterns having a fine size (nm level). The pattern may include a convex shape, a concave shape, a random shape, and the like.

The first metal layer 282a may include a plurality of nanopatterns. Nanopatterns may be referred to as patterns, dots, nanodots, particles, fine particles, protrusions, and protrusions.

The shape of the nanopattern can be random. Accordingly, the sizes of each nanopattern may be different from each other. The thickness T of each nanopattern may be different from each other. The diameter (D) of each nanopattern may be different from each other.

For example, the thickness T of the nanopattern may be approximately 0.5 nm to approximately 30 nm. For example, the diameter (D) of the nanopattern may be 0.5 nm to 300 nm. For example, the diameter D of the nanopattern may be 0.5 nm to 100 nm.

Each nanopattern may be spaced apart from each other or may be in contact with each other. For example, some nanopatterns may be spaced apart from each other, and some other nanopatterns may contact each other. Accordingly, a nanopattern group including at least two nanopatterns in contact with each other may be disposed in the plurality of first regions. A nanopattern group including at least two or more nanopatterns spaced apart from each other at different or equal intervals may be disposed in the plurality of second regions.

For example, the separation distance of each nanopattern can be expressed by Equation 1 below.

$$D \leq L \leq 3D \quad \text{[Equation 1]}$$

L represents the separation distance between nanopatterns, and D may represent the diameter of the nanopatterns.

The separation distance between the nanopatterns may be greater than or equal to the diameter of the nanopattern and may be less than or equal to 3 times the diameter of the nanopattern. For example, the separation distance between nanopatterns may be 0.5 nm to 90 nm.

A ratio of the total area of the second reflective layer 250 and the area of the first metal layer 282a may be about 1:0.5 to about 1:0.9. For example, a ratio of the total area of the second reflective layer 250 and the area of the first metal layer 282a may be approximately 1:0.5 to approximately 1:0.75.

When the ratio of the total area of the second reflective layer 250 to the area of the first metal layer 282a is less than 1:0.5, the area in which the first metal layer 282a contacts the first reflective layer is small, and thus contact resistance cannot be reduced. When the ratio of the total area of the second reflective layer 250 to the area of the first metal layer 282a is greater than 1:0.9, the structure of FIG. 16 may be substantially similar.

The second metal layer 282b may be disposed on the first metal layer 282a. Specifically, the second metal layer 282b may be disposed on the second reflective layer 250 and the first metal layer 282a.

The second metal layer 282b may include a plurality of first regions and a plurality of second regions. In this case, the first region of the second metal layer 282b may be disposed between the nanopatterns of the first metal layer 282a and may contact a part of the upper surface of the second reflective layer 250. The second region of the second metal layer 282b may contact the surface of the nanopattern of the first metal layer 282a. That is, the second region of the second metal layer 282b may surround the nanopattern of the first metal layer 282a. Nanopatterns of the first metal layer 282a may be separated by the second region of the second metal layer 282b.

According to the embodiment, since the second metal layer 282b is attached not only to the second reflective layer 250 but also to the first metal layer 282a, the adhesion of the second metal layer 282b is improved, so that separation or detachment of the second electrode 282 can be prevented.

According to the embodiment, since the first reflective layer is formed in a nanopattern having a random shape, and the second metal layer 282b is attached to the surface of the nanopattern, the attachment area of the second electrode 282 is enlarged and the adhesion of the second metal layer 282b may be further improved.

According to the embodiment, a part of the second metal layer 282b having excellent electrical conductivity may contact the second reflective layer 250. Accordingly, a current directly flows from a part of the second metal layer 282b to the second reflective layer 250, and a contact resistance with the second reflective layer 250 is minimized in another part of the second metal layer 282b such that electric current flows to the second reflective layer 250 through the first metal layer 282a to prevent current loss, thereby reducing power consumption.

In the above, it has been described that the second electrode 282 includes the first to third metal layers 282a, 282b, and 282c. In addition, the pad electrode electrically connected to the second electrode 282 may also include the first to third metal layers 282a, 282b, and 282c described above.

As another example, the pad electrode may include the second metal layer 282b and the third metal layer 282c, but may not include the first metal layer 282a. In this case, the second metal layer 282b may contact the upper surface of the passivation layer 270, but this is not limited thereto. Accordingly, the first metal layer 282a is disposed only on the second area of the second reflective layer 250 of each light emitting emitter, and is disposed on the other areas, that is, may not be disposed on the first area of the second reflective layer 250 and the passivation layer 270. The second area may surround the first area.

(Flip Chip Type Surface Emitting Laser Device)

FIG. 21 is a cross-sectional view of a flip chip type surface emitting laser device according to an embodiment.

The surface emitting laser device according to the first and second embodiments may be applied to the flip chip type surface emitting laser device shown in FIG. 21.

In addition to the vertical type, the surface emitting laser device according to the embodiment may have a flip chip type in which the first electrode 215 and the second electrode 282 face the same direction as shown in FIG. 21.

For example, as shown in FIG. 21, the surface emitting laser device according to another embodiment includes first electrode portions 215, 217, substrate 210, first reflective layer 220, active region 230, aperture region 240, the second reflective layer 250, the second electrode portions 280, 282, the first passivation layer 271, the second passivation layer 272, the non-reflective layer 290. In this case, the reflectivity of the second reflective layer 250 may be designed to be higher than that of the first reflective layer 220.

At this time, the first electrode portions 215 and 217 may include a first electrode 215 and a first pad electrode 217, and a first electrode 215 may be electrically connected to the first reflective layer 220 exposed through a predetermined mesa process. And the first pad electrode 217 may be electrically connected to the first electrode 215.

The first electrode portions 215, 217 may be made of a conductive material, and may be, for example, metal. For example, the first electrode 215 includes at least one of aluminum (Al), titanium (Ti), chromium (Cr), nickel (Ni), copper (Cu), and gold (Au), and has a single layer or multilayer structure. The first electrode 215 and the first pad electrode 217 may include the same metal or different metals.

When the first reflective layer 220 is an n-type reflective layer, the first electrode 215 may be an electrode for the n-type reflective layer.

The second electrode units 280, 282 may include a second electrode 282 and a second pad electrode 280, and the second electrode 282 is electrically connected on the second reflective layer 250, the second pad electrode 280 may be electrically connected to the second electrode 282.

When the second reflective layer 250 is a p-type reflective layer, the second electrode 282 may be a p-type electrode.

The second electrodes (see FIGS. 16 and 19) according to the first and second embodiments described above may be equally applied to the second electrode 282 of the flip-chip type surface emitting laser device.

The first insulating layer 271 and the second insulating layer 272 may be made of an insulating material, for example, nitride or oxide, for example, polyimide, silica ($SiO_2$), alternatively, at least one of silicon nitride ($Si_3N_4$) may be included.

The embodiment has a technical effect of providing a surface emitting laser device and a light emitting apparatus including the same having a highly reliable electrode structure.

In addition, the embodiment can provide a surface emitting laser device and a light emitting apparatus including the same, capable of solving an optical problem in which a beam pattern of an exit beam is split or an increase in divergence angle of beams.

In addition, the embodiment has a technical effect of providing a surface emitting laser device and a light emitting apparatus including the same, capable of improving ohmic characteristics.

(Mobile Terminal)

FIG. 22 is a perspective view of a mobile terminal to which a surface emitting laser device is applied according to an embodiment.

The vertical type surface emitting laser device according to the first and second embodiments and the flip type surface emitting laser device shown in FIG. 21 can be applied to the mobile terminal shown in FIG. 22.

As shown in FIG. 22, the mobile terminal 1500 according to the embodiment may include a camera module 1520, a flash module 1530, and an autofocus device 1510 provided on the rear side. Here, the autofocus device 1510 may include one of the packages of the surface emitting laser device according to the above-described embodiment as an emission layer.

The flash module 1530 may include a light emitting device that emits light therein. The flash module 1530 may be operated by a camera operation of a mobile terminal or a user's control.

The camera module 1520 may include an image capturing function and an auto focus function. For example, the camera module 1520 may include an auto focus function using an image.

The auto focus device 1510 may include an auto focus function using a laser. The auto focus device 1510 may be mainly used in a condition in which an auto focus function using an image of the camera module 1520 is deteriorated, for example, in a proximity or dark environment of 10 μm or less. The autofocusing device 1510 may include a light emitting layer including the surface emitting laser device of the above-described embodiment and a light receiving unit that converts light energy such as a photodiode into electrical energy.

The above detailed description should not be construed as limiting in all respects and should be considered as illustrative. The scope of the embodiments should be determined by rational interpretation of the appended claims, and all changes within the equivalent scope of the embodiments are included in the scope of the embodiments.

| [Explanation of code] | |
|---|---|
| 100: surface emitting laser device | 110: substrate |
| 111: base substrate | 113, 115: conductive pattern |
| 117: solder resist | 120: solder layer |
| 201: surface emitting laser device | 205: surface emitting laser emitting layer |
| 210: substrate | 215: first electrode |
| 215_1: first metal layer (Cu) | 215_2: second metal layer (AuGe) |
| 215_3: third metal layer (Ni) | 215_4: fourth metal layer (Au) |
| 215_5: fifth metal layer (Au) | 215_6: sixth metal layer (Ti) |
| 216_7: seventh metal layer (Au) | 217, 280: pad electrode |
| 220: first reflective layer | 230: light emitting layer |
| 240: oxide layer | 241: aperture |
| 242: insulating region | 250: second reflective layer |
| 270: passivation layer | 282: second electrode |
| 282a, 282b, 282c: metal layer | 285: wire   300: mask |
| E: emitting layer | E1, E2, E3: emitter |
| M: Mesa area | P: Pad part |

The invention claimed is:

1. A surface emitting laser device, comprising:
a substrate;
a first metal layer disposed on the substrate;
a second metal layer disposed on the first metal layer; and
a third metal layer disposed between the first metal layer and the second metal layer,
wherein the first to third metal layers include different materials,
wherein the second metal layer includes copper (Cu), and
wherein the third metal layer prevents diffusion of copper from the second metal layer into the first metal layer,
a first reflective layer on the third metal layer;
a light emitting layer on the first reflective layer;
an oxide layer on the light emitting layer;
a second reflective layer on the oxide layer; and
a second electrode on the second reflective layer,
wherein the second electrode includes a first metal layer, a second metal layer and a third metal layer disposed between the first metal layer and the second metal layer,
wherein the first metal layer of the second electrode includes a plurality of nanopatterns; and
wherein a separation distance between the nanopatterns is greater than or equal to a diameter of the nanopattern and is less than or equal to 3 times the diameter of the nanopatterns.

2. The surface emitting laser device of claim 1, further comprising a fourth metal layer disposed on the second metal layer to prevent oxidation of the second metal layer.

3. The surface emitting laser device of claim 2, further comprising a fifth metal layer disposed between the second metal layer and the third metal layer to bond the second metal layer and the third metal layer.

4. The surface emitting laser device of claim 3, wherein the first metal layer has a thickness of 5 nm to 100 nm, and the first metal layer includes at least one of AuGe, AuNi, nickel (Ni), and palladium (Pd).

5. The surface emitting laser device of claim 3, wherein the second metal layer has a thickness of 200 nm to 3000 nm, and the third metal layer has a thickness of 5 nm to 300 nm.

6. The surface emitting laser device of claim 3, wherein the third metal layer includes at least one of nickel (Ni), platinum (Pt), tungsten (W), and TiW.

7. The surface emitting laser device of claim 2, wherein the fourth metal layer has a thickness of 0.3 nm to 50 nm, and the fourth metal layer includes at least one of gold (Au), platinum (Pt), and tungsten (W).

8. The surface emitting laser device of claim 3, wherein the fifth metal layer has a thickness of 5 nm to 100 nm, and the fifth metal layer includes at least one of titanium (Ti), palladium (Pd), and chromium (Cr).

9. The surface emitting laser device of claim 2, wherein the fourth metal layer includes particles, and wherein the particles are disposed on a lower surface of the second metal layer, and wherein the density of the particles decreases as a distance increases from the lower surface of the second metal layer.

10. A surface emitting laser apparatus, including:
a first substrate;
a surface emitting laser device disposed on the first substrate; and
a solder layer disposed between the first substrate and the surface emitting laser device,
wherein the surface emitting laser device includes the surface emitting laser device according to claim 1.

11. The surface emitting laser device of claim 1, wherein the first metal layer of the second electrode includes a metal having a work function equal to or greater than that of the second reflective layer.

12. The surface emitting laser device of claim 1, wherein a ratio of a work function of the second reflective layer to a work function of the first metal layer of the second electrode ranges 1:0.8 to 1:1.2.

13. The surface emitting laser device of claim 12, wherein difference between the work function of first metal layer of the second electrode and the work function of the second reflective layer is less than 0.15 eV.

14. The surface emitting laser device of claim 1, wherein a thickness of the first metal layer of the second electrode is 5 nm to 30 nm.

15. The surface emitting laser device of claim 1, wherein a ratio of a thickness of the first metal layer of the second electrode to a thickness of the second metal layer of the second electrode ranges 1:3 to 1:10.

16. The surface emitting laser device of claim 1, wherein a thickness of the third metal layer of the second electrode is equal to or greater than that of the second metal layer of the second electrode.

17. The surface emitting laser device of claim 1, wherein the second metal layer of the second electrode includes a first region and a second region,
wherein the first region is disposed between the nanopatterns of the first metal layer of the second electrode and contact a part of an upper surface of the second reflective layer, and wherein the second region contacts the nanopattern of the first metal layer of the second electrode.

* * * * *